(12) United States Patent
Isaka et al.

(10) Patent No.: US 7,767,547 B2
(45) Date of Patent: Aug. 3, 2010

(54) MANUFACTURING METHOD OF SOI SUBSTRATE

(75) Inventors: Fumito Isaka, Kanagawa (JP); Sho Kato, Kanagawa (JP); Kosei Nei, Kanagawa (JP); Ryu Komatsu, Kanagawa (JP); Tatsuya Mizoi, Yokohama (JP); Akihisa Shimomura, Kanagawa (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 0 days.

(21) Appl. No.: 12/360,419

(22) Filed: Jan. 27, 2009

(65) Prior Publication Data
US 2009/0197392 A1   Aug. 6, 2009

(30) Foreign Application Priority Data
Feb. 6, 2008   (JP)   ............... 2008-026447

(51) Int. Cl.
*H01L 21/46* (2006.01)
(52) U.S. Cl. ............... 438/458; 438/455; 257/E21.568
(58) Field of Classification Search ........ 438/455, 438/458, 459; 257/E21.568
See application file for complete search history.

(56) References Cited

U.S. PATENT DOCUMENTS

| | | | |
|---|---|---|---|
| 5,374,564 A | 12/1994 | Bruel | |
| 6,191,007 B1 * | 2/2001 | Matsui et al. | 438/459 |
| 6,251,754 B1 | 6/2001 | Ohshima et al. | |
| 6,372,609 B1 | 4/2002 | Aga et al. | |
| 6,818,529 B2 | 11/2004 | Bachrach et al. | |
| 7,405,136 B2 | 7/2008 | Delprat et al. | |

FOREIGN PATENT DOCUMENTS

| | | |
|---|---|---|
| JP | 05-211128 | 8/1993 |
| JP | 11-074209 | 3/1999 |
| JP | 11-163363 | 6/1999 |
| JP | 2000-124092 | 4/2000 |
| JP | 2003-257804 | 9/2003 |
| JP | 2007-251129 | 9/2007 |

* cited by examiner

*Primary Examiner*—Bradley K Smith
(74) *Attorney, Agent, or Firm*—Eric J. Robinson; Robinson Intellectual Property Law Office, P.C.

(57) ABSTRACT

An SOI substrate is manufactured by a method in which a first insulating film is formed over a first substrate over which a plurality of first single crystal semiconductor films is formed; the first insulating film is planarized; heat treatment is performed on a single crystal semiconductor substrate attached to the first insulating film; a second single crystal semiconductor film is formed; a third single crystal semiconductor film is formed using the first single crystal semiconductor films and the second single crystal semiconductor films as seed layers; a fragile layer is formed by introducing ions into the third single crystal semiconductor film; a second insulating film is formed over the third single crystal semiconductor film; heat treatment is performed on a second substrate superposed on the second insulating film; and a part of the third single crystal semiconductor film is fixed to the second substrate.

11 Claims, 12 Drawing Sheets

MANUFACTURING METHOD OF SOI SUBSTRATE

BACKGROUND OF THE INVENTION

1. Field of the Invention

The present invention relates to a method for manufacturing a silicon on insulator (SOI) substrate and a method for manufacturing a semiconductor device.

2. Description of the Related Art

In recent years, LSI technology has been dramatically progressed, and an SOI structure which is capable of realizing speeding up and low power consumption has been attracted attention. This technology allows an active region (channel formation region) of a field effect transistor (FET), which has been conventionally formed using bulk single crystal silicon, to be formed using a single crystal silicon thin film. It is known that a MOS field effect transistor manufactured using an SOI structure has lower parasitic capacitance than a conventional field effect transistor manufactured using a bulk single crystal silicon substrate, which is an advantage in increasing speed.

As examples of a substrate having an SOI structure (also referred to as an SOI substrate), a SIMOX substrate, a bonded substrate, and the like are given. For example, a SIMOX substrate obtains an SOI structure through the following manner: oxygen ions are implanted into a single crystal silicon substrate and heat treatment is performed at 1300° C. or higher in order to form a buried oxide (BOX) film, whereby a single crystal silicon thin film is formed on the surface of the buried oxide film. In the SIMOX substrate, oxygen ion implantation can be controlled precisely, and thus a single crystal silicon thin film having a uniform thickness can be formed with high control; however, there is a problem in time and costs because it is necessary to take a long time for oxygen ion implantation. In addition, there is another problem in that a single crystal silicon thin film is easily damaged in oxygen ion implantation.

A bonded substrate obtains an SOI structure through the following manner: two single crystal silicon substrates (a base substrate and a bond substrate) are bonded to each other with an oxide film interposed therebetween, and one of the single crystal silicon substrates (the bond substrate) is thinned by grinding and polishing on its rear side (a plane which is not a surface to be bonded), whereby a single crystal silicon thin film is formed. Since it is difficult to form a uniform thin single crystal silicon thin film by grinding and polishing, a technique called a Smart Cut (registered trademark) method for thinning a film, which employs hydrogen ion implantation (e.g., see Reference 1: Japanese Published Patent Application No. H5-211128) is proposed.

Further, a method for forming a single crystal silicon layer over a supporting substrate made of glass by using such a Smart Cut method has been proposed (e.g., see Reference 2: Japanese Published Patent Application No. H11-163363).

Furthermore, in order to increase productivity of semiconductor devices using SOI substrates and to provide large-sized semiconductor devices, an SOI substrate having a larger size has been desired. For example, Reference 3 (Japanese Published Patent Application No. 2003-257804) proposes a method for manufacturing a large-sized SOI substrate in which a plurality of silicon wafers is arranged over a large-sized supporting substrate and is bonded to each other and an epitaxially grown film is formed over the plurality of silicon wafers, whereby a large-sized SOI substrate is manufactured.

SUMMARY OF THE INVENTION

Glass substrates may have larger sizes and are less expensive than silicon wafers; thus, glass substrates are mainly used for manufacturing liquid crystal display devices or the like. By using a glass substrate as a base substrate (a substrate to be separated), a large-sized inexpensive SOI substrate can be manufactured. In this case, when a single crystal semiconductor film is formed over a glass substrate with an insulating film interposed therebetween by the Smart Cut method, it is necessary to separate a part of the silicon wafer and form the part of the silicon wafer over the glass substrate serving as the substrate to be separated with the silicon wafer used as a separation substrate.

However, when the characteristics (such as thermal expansion coefficient and the amount of bent) of the separation substrate and the substrate to be separated are different, defective bonding might be caused due to heat treatment performed after bonding, or the like. In particular, when a substrate other than a semiconductor substrate such as a glass substrate is used as a substrate to be separated, materials of the substrates which are bonded to each other are different, and thus defective bonding is easily caused.

Moreover, when the same separation substrate is reused repeatedly, the quality of the separation substrate is reduced due to repeated reuse of the same separation substrate, and thus the quality of an SOI substrate manufactured using the separation substrate might be reduced. In particular, when as many SOI substrates as possible are intended to be manufactured using one silicon wafer, the thickness of the substrate is reduced due to repeated reuse of the same separation substrate, and thus the separation substrate might be broken in a manufacturing process or the incidence rate of defective bonding might be increased. Furthermore, quality differences might be caused between a first-manufactured SOI substrate and an nth-manufactured SOI substrate (n is a natural number of 2 or more), which are manufactured using the same one silicon wafer.

Furthermore, in particular, in the case where a glass substrate has a large area, a plurality of silicon wafers needs to be attached to the large-sized glass substrate; however, there is a problem in that gaps (joint portions) of at least about 100 μm to 200 μm are generated between silicon wafers which are adjacent to each other even though the silicon wafers are densely attached to the glass substrate. Reference 3 (Japanese Published Patent Application No. 2003-257804) discloses a method in which an amorphous semiconductor layer is formed in the gap and is epitaxially grown, so that a large-sized single crystal semiconductor film is formed. However, heat treatment needs to be performed for a long time in order to epitaxially grow and single-crystallize the amorphous semiconductor layer formed in the gap of about 100 μm to 200 μm, and operating efficiency is extremely low. Further, a substrate with low heat resistance such as a glass substrate is unsuitable for heat treatment performed for a long time. Furthermore, in the case where the amorphous semiconductor layer formed in the gap is single-crystallized by epitaxial growth, crystals grow in a lateral direction with a single crystal semiconductor layer derived from a silicon wafer used as a seed layer; however, there is a problem in that unevenness is formed on the surface of the single crystal semiconductor layer due to crystal growth in a lateral direction.

In view of the above-described problems, it is an object to provide a method for manufacturing an SOI substrate, which makes it possible to reduce occurrence of defective bonding and to form a large-sized single crystal semiconductor film especially when manufacturing a large-sized SOI substrate.

It is another object to provide a method for manufacturing an SOI substrate, which suppresses consumption and damage of a separation substrate and reduces quality differences between a plurality of SOI substrates when manufacturing the plurality of SOI substrates.

A method for manufacturing an SOI substrate, which is disclosed in this specification, includes the steps of forming a plurality of first single crystal semiconductor films over a first substrate having an insulating surface with intervals between the plurality of first single crystal semiconductor films; forming a first insulating film which functions as a bonding layer over the first single crystal semiconductor films so as to cover the first substrate; performing planarization treatment on the first insulating film; superposing a plurality of single crystal semiconductor substrates in each of which a first fragile layer is formed at a predetermined depth on the first insulating film such that the semiconductor film is superimposed over the plurality of single crystal semiconductor substrates; forming a plurality of second single crystal semiconductor films over the first insulating film by separation at the first fragile layer through heat treatment; exposing the first single crystal semiconductor films by etching the first insulating film with the second single crystal semiconductor films used as masks; forming a third single crystal semiconductor film over the first substrate using the first single crystal semiconductor films and the second single crystal semiconductor films as seed layers; forming a second fragile layer by introducing ions into the third single crystal semiconductor film; forming a second insulating film which functions as a bonding layer over the third single crystal semiconductor film; and fixing a part of the third single crystal semiconductor film to the second substrate with the second insulating film interposed therebetween by superposing the first substrate on a second substrate having an insulating surface and separating the third single crystal semiconductor film at the second fragile layer through heat treatment.

Another method for manufacturing an SOI substrate, which is disclosed in this specification, includes the steps of forming a plurality of first single crystal semiconductor films over a first substrate having an insulating surface with intervals between the plurality of first single crystal semiconductor films; forming a semiconductor film over the first single crystal semiconductor films so as to cover the first substrate; performing planarization treatment on the semiconductor film so as to expose the first single crystal semiconductor films; forming a first insulating film over the first single crystal semiconductor films and the semiconductor film; superposing a plurality of single crystal semiconductor substrates in each of which a first fragile layer is formed at a predetermined depth on the first insulating film such that the semiconductor film is superimposed over the plurality of single crystal semiconductor substrates; forming a plurality of second single crystal semiconductor films over the first insulating film by separation at the first fragile layer through heat treatment; exposing the first single crystal semiconductor films by etching the first insulating film with the second single crystal semiconductor films used as masks; forming a third single crystal semiconductor film over the first substrate using the first single crystal semiconductor films and the second single crystal semiconductor films as seed layers; forming a second fragile layer by introducing ions into the third single crystal semiconductor film; forming a second insulating film which functions as a bonding layer over the third single crystal semiconductor film; and fixing a part of the third single crystal semiconductor film to the second substrate with the second insulating film interposed therebetween by superposing the first substrate on a second substrate having an insulating surface and separating the third single crystal semiconductor film at the second fragile layer through heat treatment.

Further, the above-described methods for manufacturing an SOI substrate may further include the steps of forming a single crystal semiconductor film over the second substrate; forming a third fragile layer by introducing ions into the single crystal semiconductor film over the second substrate; forming a third insulating film over the second substrate; and fixing a part of the single crystal semiconductor film to a third substrate with the third insulating film interposed therebetween by superposing the third substrate on the second substrate and separating the single crystal semiconductor film at the third fragile layer through second heat treatment.

The above-described manufacturing method solves at least one of the above-described problems.

Note that in this specification, the SOI substrate includes a substrate in which an insulating layer is sandwiched between a single crystal semiconductor film and a semiconductor substrate and a substrate in which a quartz substrate, a glass substrate, a ceramic substrate, or a metal substrate is employed instead of the semiconductor substrate.

Further, the term "semiconductor device" in this specification refers to all devices which are capable of functioning by utilizing semiconductor characteristics, and electro-optical devices, semiconductor circuits, and electronic devices are all included in the semiconductor devices.

Furthermore, the term "display device" in this specification includes a light-emitting device and a liquid crystal display device in its category. The light-emitting device includes a light-emitting element, and the liquid crystal display device includes a liquid crystal element. The light-emitting element includes, in its category, an element whose luminance is controlled by a current or a voltage, and specifically includes, in its category, an inorganic electroluminescent (EL) element, an organic EL element, and the like.

Note that the ordinal numbers such as "first" and "second" in this specification are used for convenience and do not denote the order of steps and the stacking order of layers. In addition, the ordinal numbers in this specification do not denote particular names which specify the invention.

Occurrence of defective bonding can be reduced and a large-sized single crystal semiconductor film can be formed even when manufacturing a large-sized SOI substrate. Moreover, damage of a separation substrate can be suppressed and quality differences between a plurality of SOI substrates can be reduced even when manufacturing the plurality of SOI substrates.

DETAILED DESCRIPTION OF THE INVENTION

Embodiment Mode

Figure 1A:
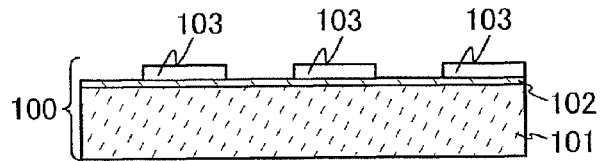
FIGS. 1A to 1K are diagrams showing an example of a method for manufacturing an SOI substrate.

Embodiment modes will be hereinafter described based on the accompanying drawings. Note that the invention disclosed in this specification can be carried out in many different modes, and it will be readily appreciated by those skilled in the art that modes and details of the present invention can be modified in various ways without departing from the spirit and scope of the present invention. Therefore, the invention disclosed in this specification should not be interpreted as being limited to the description of the embodiment modes. In the drawings for describing the embodiment modes, the same reference numerals are commonly given to like components, and the components will not be described repeatedly.

Embodiment Mode 1

In this embodiment mode, an example of a method for manufacturing an SOI substrate will be described with reference to drawings.

First, a first SOI substrate 100 is prepared (see FIG. 1A).

In the first SOI substrate 100, a plurality of first single crystal semiconductor films 103 can be provided in a line over a first substrate 101 with an insulating film 102 interposed therebetween.

As the first substrate 101, a substrate made of an insulator is used. Specifically, as the first substrate 101, a glass substrate used in the electronics industry, such as an aluminosilicate glass substrate, an aluminoborosilicate glass substrate, or a barium borosilicate glass substrate is used. Alternatively, a plastic substrate which has heat resistance against a processing temperature of this process and has an insulating film (e.g., a silicon oxide film or a silicon oxynitride film) on its surface can be used. With the use of a glass substrate or a plastic substrate which can have a large size and is inexpensive as the first substrate 101, the cost can be reduced more than in the case of using a silicon wafer. In this embodiment mode, a substrate which is other than a semiconductor substrate such as a silicon wafer (a non-semiconductor substrate), particularly a substrate has a larger size than a semiconductor substrate such as a silicon wafer is used as the first substrate 101.

As the insulating film 102, a single layer of a silicon oxide film, a silicon oxynitride film, a silicon nitride film, a silicon nitride oxide film, or the like, or a stacked layer thereof can be used. Note that the term "silicon oxynitride film" means a film which has a larger number of oxygen atoms than that of nitrogen atoms, and in the case where measurements are performed using Rutherford backscattering spectrometry (RBS) and hydrogen forward scattering (HFS), the silicon oxynitride film includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, the term "silicon nitride oxide film" means a film which has a larger number of nitrogen atoms than that of oxygen atoms, and in the case where measurements are performed using RBS and HFS, the silicon nitride oxide film includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the above-described ranges, in the case where the total number of atoms contained in the silicon oxynitride or the silicon nitride oxide is defined as 100 at. %.

The plurality of first single crystal semiconductor films 103 can be each formed using single crystal silicon films or the like. Here, the first single crystal semiconductor film is formed by attaching the first substrate 101 to a single crystal semiconductor substrate such as a silicon wafer in which a fragile layer is formed by irradiation of an ion beam including ions accelerated by an electric field through the surface of the single crystal semiconductor substrate to introduce the ions into a region at a predetermined depth and separating them through heat treatment.

In this embodiment mode, the first single crystal semiconductor films 103 separated from a plurality of single crystal semiconductor substrates are arranged in a line over the first substrate 101. Further, the first single crystal semiconductor film 103 and another first single crystal semiconductor film 103 do not need to be arranged without a gap between them. For example, the first single crystal semiconductor films 103 may be arranged with intervals of about 200 μm or more between them.

Note that the step of attaching a plurality of single crystal semiconductor substrates to the first substrate 101 is not necessarily limited to only one time, and the step may be repeatedly performed plural times to form the first single crystal semiconductor films 103. Further, in the case where a plurality of single crystal semiconductor substrates is attached to the first substrate 101 through a plurality of steps, it is preferable that end portions of the single crystal semiconductor substrates be etched in advance before the single crystal semiconductor substrates are attached to the first substrate 101. This is because this etching step makes it possible to prevent generation of flaws in the surface of the single crystal semiconductor films formed over the first substrate 101 when the single crystal semiconductor substrates are attached for the second time and after that.

The thickness of the first single crystal semiconductor films 103 is preferably 20 nm to 250 nm. Note that the term "single crystal" in this specification refers to a crystal in which crystal faces and crystal axes are aligned and atoms or molecules which are included in the single crystal are aligned in a spatially ordered manner. However, although a single crystal is structured by orderly aligned atoms, a single crystal may include a lattice defect in which part of the alignment is disordered and a single crystal may include intended or unintended lattice distortion.

Figure 1B:
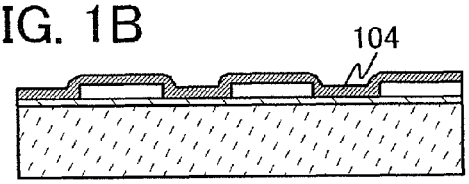

Next, a semiconductor film 104 is formed over the plurality of first single crystal semiconductor films 103 (see FIG. 1B). Note that in FIG. 1B, the semiconductor film 104 is formed over an entire surface of the first substrate 101.

As the semiconductor film 104, a silicon film can be formed to a thickness of 20 nm to 1000 nm by a CVD method or the like. In this embodiment mode, an amorphous semiconductor film (e.g., an amorphous silicon film) is formed to a thickness of 20 nm to 250 nm over the first single crystal semiconductor films 103. The thickness of the semiconductor film 104 may be set as appropriate in accordance with the thickness of the first single crystal semiconductor films 103.

Further, the semiconductor film 104 may be formed by applying a liquid material containing a semiconductor material by a spin coating method, an inkjet method, or the like and solidifying the liquid material through heat treatment. By forming the semiconductor film 104 using the liquid material, gaps between the plurality of first single crystal semiconductor films 103 can be filled. As the liquid material, for example, a solution in which high-order silane such as cyclopentasilane (abbreviation: CPS) is dissolved in an organic solvent can be used.

Next, planarization treatment is performed on a surface of the semiconductor film 104 to expose each of the plurality of first single crystal semiconductor films 103. As the planarization treatment, chemical mechanical polishing (CMP), etching treatment, laser light irradiation, or the like can be performed. For example, the surface of the semiconductor film 104 can be planarized by laser light irradiation which is performed after etching treatment (etch-back treatment) of either dry etching or wet etching, or a combination thereof.

Further, before planarization treatment, heat treatment may be performed, so that the semiconductor film 104 formed over each of the first single crystal semiconductor films 103 is epitaxially grown (solid phase grown) and crystallized, and then the semiconductor film 104 may be planarized. Epitaxial growth of the semiconductor film 104 formed over each of the first single crystal semiconductor films 103 makes it possible to increase the thicknesses of the first single crystal semiconductor films 103.

For the heat treatment, a heating furnace, laser irradiation, rapid thermal annealing (RTA), or a combination thereof can be used. For example, after the semiconductor film 104 is formed over the first single crystal semiconductor films 103, heat treatment is performed by RTA at 500° C. to 800° C. for 5 sec to 180 sec, whereby the semiconductor film 104 formed over the first single crystal semiconductor films 103 is crystallized.

Figure 1C:
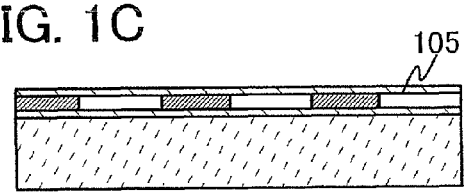

Then, an insulating film 105 is formed over the single crystal semiconductor films 103 which are exposed and the semiconductor film 104 (see FIG. 1C). The insulating film 105 functions as a layer which is bonded to a separation substrate (a bonding layer) and can be a silicon oxide film or a silicon oxynitride film formed by a CVD method, a sputtering method, or the like. In addition, since the insulating film 105 functions as a bonding layer, its surface is preferably flat. Here, a silicon oxide layer which is deposited by a CVD method using organosilane as a source gas is used. Alternatively, a silicon oxide layer or a silicon oxynitride layer which is deposited by a CVD method using silane as a source gas can be used.

Note that without formation of the semiconductor film 104, the insulating film 105 is deposited over the first single crystal semiconductor films 103 so as to cover the first substrate, so that the gaps between the first single crystal semiconductor films 103 which are provided at intervals may be filled, and after that, planarization treatment may be performed on the insulating film 105.

Figure 1D:
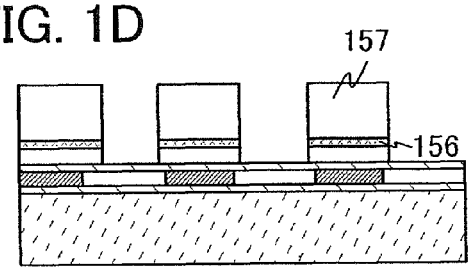

Next, a plurality of single crystal semiconductor substrates 157 in each of which a fragile layer 156 is formed at a predetermined depth from the surface thereof is prepared, and surfaces of the single crystal semiconductor substrates 157 are each superposed on the insulating film 105 which functions as a bonding layer (see FIG. 1D). Here, the single crystal semiconductor substrates 157 are provided over the insulating film 105 such that either or both of the first single crystal semiconductor films 103 or/and the single crystal semiconductor substrates 157 are superimposed over the first substrate 101. In FIG. 1D, the single crystal semiconductor substrates 157 are each superposed on the semiconductor film 104 with the insulating film 105 interposed therebetween. Further, at least parts of both end portions of the single crystal semiconductor substrates 157 are each preferably superposed on the first single crystal semiconductor films 103 with the insulating film 105 interposed therebetween.

As the single crystal semiconductor substrate 157, a commercial semiconductor substrate can be used. For example, a single crystal silicon substrate, a single crystal germanium substrate, and a compound semiconductor substrate of gallium arsenide, indium phosphide, or the like can be used. Typically, sizes of the commercial silicon substrates are 5 inches (125 mm), 6 inches (150 mm), 8 inches (200 mm), 12 inches (300 mm), and 18 inches (450 mm) in diameter and shapes of the commercial silicon substrates are circular. Note that the shape is not limited to the circular shape, and a silicon substrate which is processed into a rectangular shape or the like can be used.

The fragile layer 156 can be formed in such a manner that the single crystal semiconductor substrate 157 is irradiated with an ion beam including ions accelerated by an electric field to introduce the ions into a region at a predetermined depth from the surface of the single crystal semiconductor substrate 157. A source gas is excited to generate plasma of the source gas, and then ions included in the plasma are extracted by an effect of an electric field, whereby the ion beam is generated.

The depth at which the fragile layer 156 is formed can be adjusted by the acceleration energy of the ion beam and the incidence angle thereof. The acceleration energy can be adjusted by an acceleration voltage, dosage, or the like. The fragile layer 156 is formed in a region at the same depth or almost the same depth as the average penetration depth of the ions. The thickness of a single crystal semiconductor film which is to be separated from the single crystal semiconductor substrate 157 in a later step is determined depending on the depth at which ions are introduced. The depth at which the fragile layer 156 is formed is greater than or equal to 10 nm and less than or equal to 500 nm, preferably, greater than or equal to 50 nm and less than or equal to 200 nm.

In order to introduce ions, an ion doping method without mass separation being performed or an ion implantation method with mass separation being performed can be used.

As a source gas which is used for introducing ions, a hydrogen gas, a rare gas, and the like are given. In this embodiment mode, a hydrogen gas is preferably used. When a hydrogen gas is used in an ion doping method, ion species which are generated are $H^+$, $H_2^+$, and $H_3^+$, and it is preferable that the number of $H_3^+$ which is introduced be the largest. The introduction efficiency of $H_3^+$ ions is better than that of $H^+$ ions and $H_2^+$ ions; thus, reduction in introduction time can be achieved. Moreover, a crack is easily generated in the fragile layer in a later step.

It is preferable that an insulating film be provided over the single crystal semiconductor substrate 157 before ions are introduced. The provision of the insulating film makes it possible to prevent an impurity from being attached to the surface of the single crystal semiconductor substrate 157 or prevent the surface from being etched by introduction of ions. As the insulating film, a single layer of a silicon oxide film, a silicon oxynitride film, a silicon nitride film, a silicon nitride oxide film, or the like, or a stacked layer thereof can be used. In this case, such an insulating film is formed over the insulating film 105.

A surface of the insulating film 105 formed over the first SOI substrate 100 and the surface of the single crystal semiconductor substrate 157 are disposed in close contact with each other, so that a bond is formed. This bond is formed under the action of a van der Waals force, and by pressure bonding of the first SOI substrate 100 and the single crystal semiconductor substrate 157, a strong bond can be formed by hydrogen bonding using Si—H and Si—OH bonds, and the like.

Note that it is preferable that a bonding plane be cleaned by megasonic cleaning, or by megasonic cleaning and cleaning with ozone water before the first SOI substrate 100 and the single crystal semiconductor substrate 157 are bonded to each other. With such treatment, dust such as an organic substance on the bonding plane can be removed and the surfaces can be made hydrophilic.

Figure 1E:
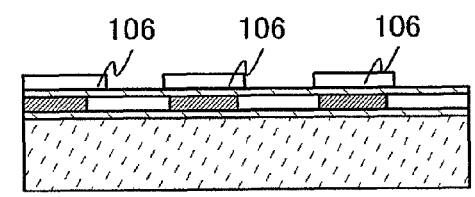

Next, heat treatment is performed to make separation (cleavage) occur at the fragile layer 156, so that a part of the single crystal semiconductor substrate 157 is separated and formed over the first SOI substrate 100 (see FIG. 1E). Here, by heat treatment at 400° C. to 700° C., a change in the volume of microvoids of ions (e.g., hydrogen ions) included in the fragile layer 156 occurs, which enables cleavage to occur along the fragile layer 156. Accordingly, the plurality of single crystal semiconductor substrates 157 is attached to the first SOI substrate 100 and is separated by performing heat treatment on each of the plurality of single crystal semiconductor substrates 157, whereby a plurality of second single crystal semiconductor films 106 is formed. Note that in the separation process shown in FIG. 1E, the single crystal semiconductor substrate 157 serves as a separation substrate and the first SOI substrate 100 serves as a substrate to be separated.

Figure 1F:
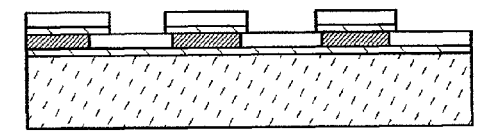

Then, the insulating film 105 is etched with the second single crystal semiconductor films 106 used as masks (see FIG. 1F). Through this etching step, the first single crystal semiconductor film 103 is exposed at a region between the second single crystal semiconductor film 106 and another second single crystal semiconductor film 106.

Figure 1G:
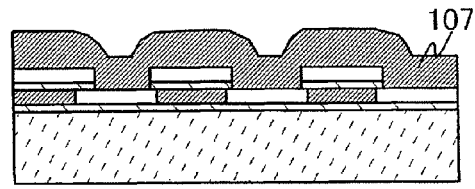

Next, a semiconductor film 107 is formed over the first single crystal semiconductor films 103 which are exposed and the second single crystal semiconductor films 106 (see FIG. 1G).

As the semiconductor film 107, a silicon film can be formed to a thickness of 20 nm to 1000 nm by a CVD method or the like. In this embodiment mode, an amorphous semiconductor film (e.g., an amorphous silicon film) is formed to a thickness of 20 nm to 250 nm over the first single crystal semiconductor films 103 and the second single crystal semiconductor films 106. The thickness of the semiconductor film 107 may be set as appropriate in accordance with the thickness of the second single crystal semiconductor film 106.

Further, the semiconductor film 107 may be formed by applying a liquid material containing a semiconductor material by a spin coating method, an inkjet method, or the like and solidifying the liquid material through heat treatment. By forming the semiconductor film 107 using the liquid material, gaps between the second single crystal semiconductor film 106 and another second single crystal semiconductor film 106 can be filled. As the liquid material, for example, a solution in which high-order silane such as cyclopentasilane (abbreviation: CPS) is dissolved in an organic solvent can be used.

Figure 1H:
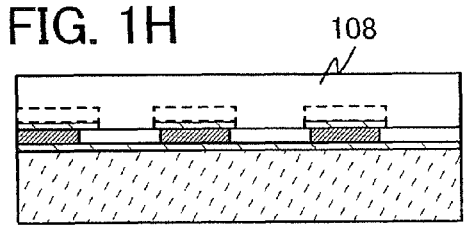

Next, the semiconductor film 107 formed over the first single crystal semiconductor films 103 and the second single crystal semiconductor films 106 is epitaxially grown (solid phase grown) and crystallized (see FIG. 1H). As a result, a third single crystal semiconductor film 108 is formed over the first single crystal semiconductor films 103 and the second single crystal semiconductor films 106. Here, at a region where the third single crystal semiconductor film 108 is superimposed over the second single crystal semiconductor film 106, the single crystal semiconductor film is grown in a longitudinal direction using the second single crystal semiconductor film 106 as a seed layer. At a region where the third single crystal semiconductor film 108 is superimposed over the first single crystal semiconductor film 103, the single crystal semiconductor film is grown in a longitudinal direction using the first single crystal semiconductor film 103 as a seed layer.

For the heat treatment, a heating furnace, laser irradiation, rapid thermal annealing (RTA), or a combination thereof can be used. Here, after the semiconductor film 107 is formed over the second single crystal semiconductor films 106, heat treatment is performed by RTA at 500° C. to 800° C. for 5 sec to 180 sec, whereby the semiconductor film 107 is crystallized.

Next, planarization treatment is performed on a surface of the third single crystal semiconductor film 108. As the planarization treatment, chemical mechanical polishing (CMP), etching treatment, laser light irradiation, or the like can be performed. For example, the surface of the third single crystal semiconductor film 108 can be planarized by laser light irradiation which is performed after etching treatment (etch-back treatment) of either dry etching or wet etching, or a combination thereof. Note that the third single crystal semiconductor film 108 may be formed by heat treatment after the semiconductor film 107 is planarized.

Figure 1I:
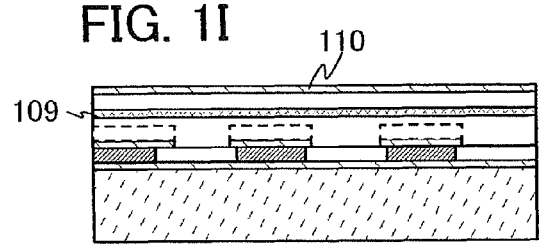

Then, a fragile layer 109 is formed in the third single crystal semiconductor film 108 at a predetermined depth from the surface thereof by irradiation of an ion beam including ions accelerated by an electric field (see FIG. 1I). The fragile layer 109 can be formed by a method similar to the method for forming the fragile layer 156 in the single crystal semiconductor substrate 157.

After formation of the fragile layer 109, an insulating film 110 functioning as a bonding layer is formed over the third single crystal semiconductor film 108. The insulating film 110 functions as a layer which is bonded to a separation substrate (a bonding layer) and can be a silicon oxide film or a silicon oxynitride film formed by a CVD method, a sputtering method, or the like. In addition, since the insulating film 110 functions as a bonding layer, its surface is preferably flat. Here, a silicon oxide layer which is deposited by a CVD method using organosilane as a source gas is used. Alternatively, a silicon oxide layer or a silicon oxynitride layer which is deposited by a CVD method using silane as a source gas can be used.

Figure 1J:
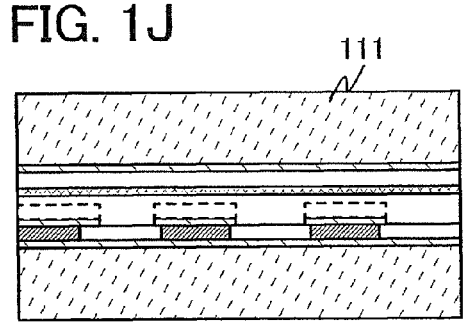

Next, a surface of the insulating film 110 formed over the first SOI substrate 100 and a surface of a second substrate 111 are made to face each other, so that the surface of the insulating film 110 which functions as a bonding layer and the surface of the second substrate 111 are bonded to each other (see FIG. 1J). The surface of the insulating film 110 formed over the first SOI substrate 100 and the surface of the second substrate 111 are disposed in close contact with each other, so that a bond is formed. This bond is formed under the action of a van der Waals force, and by pressure bonding of the first SOI substrate 100 and the second substrate 111, a strong bond can be formed by hydrogen bonding using Si—H and Si—OH bonds, and the like.

As the second substrate 111, a substrate made of the same material as the first substrate 101 included in the first SOI substrate 100 is preferably used. For example, a glass substrate can be used as the first substrate 101 and the second substrate 111.

The use of a substrate made of the same material as the first substrate 101 as the second substrate 111 makes it possible to reduce the difference in thermal expansion between the substrates and the difference in contraction due to heat treatment between the substrates, even when the heat treatment is performed after the first SOI substrate 100 and the second substrate 111 are bonded to each other. Accordingly, occurrence of defective bonding can be suppressed.

Note that it is preferable that a bonding plane be cleaned by megasonic cleaning, or by megasonic cleaning and cleaning with ozone water before the first SOI substrate 100 and the second substrate 111 are bonded to each other. With such treatment, dust such as an organic substance on the bonding plane can be removed and the surfaces can be made hydrophilic.

Figure 1K:
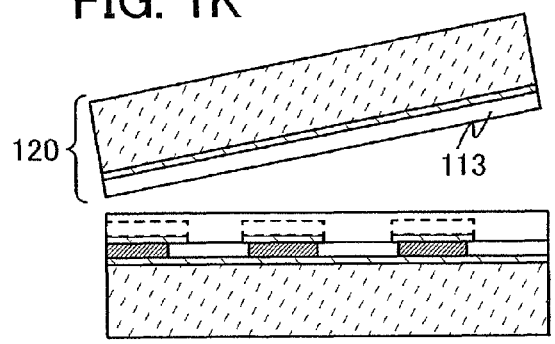

Next, heat treatment is performed to make separation (cleavage) occur at the fragile layer 109, so that a part of the crystallized semiconductor film (the third single crystal semiconductor film 108) is separated and is fixed to the second substrate 111 (see FIG. 1K). Here, by heat treatment at 400° C. to 700° C., a change in the volume of microvoids of ions (e.g., hydrogen ions) included in the fragile layer 109 occurs, which enables cleavage to occur along the fragile layer 109. Accordingly, a single crystal semiconductor film 113 (a part of the third single crystal semiconductor film 108) is formed on the second substrate 111 with the insulating film 110 interposed therebetween, while the third single crystal semiconductor film 108 which has not been separated remains over the first substrate 101. Note that in the separation process shown in FIG. 1K, the first SOI substrate 100 serves as a separation substrate and the second substrate 111 serves as a substrate to be separated.

Through the above-described steps, a second SOI substrate 120 can be formed in which the single crystal semiconductor film 113 is formed on the second substrate 111 with the insulating film 110 interposed therebetween.

As described above, the SOI substrate is used as a separation substrate and the substrate made of the same material as the substrate included in the SOI substrate which is the separation substrate is used as a substrate to be separated, so that occurrence of defective bonding can be reduced even when the SOI substrate including a substrate other than a semiconductor substrate is manufactured. Moreover, the second SOI substrate 120 formed using the second substrate 111 which is a substrate to be separated is used as a separation substrate, so that throughput can be increased in a mass production process of a plurality of SOI substrates.

Further, in accordance with this embodiment mode, a single crystal semiconductor film is grown from a seed layer in a longitudinal direction. Thus, a large-sized single crystal semiconductor film can be formed without formation of unevenness on the surface. Furthermore, in the case where a seed layer is formed of a single layer, single crystal semiconductor substrates need to be attached to each other without gaps between them; however, because a seed layer including a plurality of layers in which the first single crystal semiconductor film and the second single crystal semiconductor film are alternately superimposed is used in this embodiment mode, the first single crystal semiconductor films do not need to be arranged without gaps between them and the second single crystal semiconductor films do not need to be arranged without gaps between them. Therefore, when the single crystal semiconductor substrate is attached, the alignment margin can be maintained.

In addition, in this embodiment mode, the thickness of the semiconductor film to be single-crystallized by solid phase growth is, for example, 20 nm to 1000 nm. Thus, heat treatment time can be much shorter than the case, for example, in which the semiconductor film formed in the gap of about 200 µm is single-crystallized by lateral growth. Further, since the heat treatment time is short, a glass substrate with low heat resistance can be used as a supporting substrate.

In the above-described step, planarization treatment may be performed on either one or both of the surfaces of a first SOI substrate 100' and the second SOI substrate 120, which have been separated. By the planarization treatment, a surface of the second single crystal semiconductor film 106 or the surface of the third single crystal semiconductor film 108 can be planarized even when unevenness occurs on the surfaces after separation.

As the planarization treatment, chemical mechanical polishing (CMP), etching treatment, laser light irradiation, or the like can be performed. Here, the single crystal semiconductor film is recrystallized and the surface thereof is planarized by laser light irradiation which is performed after etching treatment (etch-back treatment) of either dry etching or wet etching, or a combination thereof.

By irradiation with laser light from above the top surface of the single crystal semiconductor film, the top surface of the single crystal semiconductor film can be melted. After being melted, the single crystal semiconductor film is cooled and solidified to obtain a single crystal semiconductor film having the top surface whose planarity is improved. With the use of laser light, the first substrate 101 or the second substrate 111 is not directly heated; thus, increase in the temperature of the first substrate 101 or the second substrate 111 can be suppressed. Thus, a substrate with low heat resistance such as a glass substrate can be used as the first substrate 101 or the second substrate 111.

Note that it is preferable that the single crystal semiconductor film be partially melted by the laser light irradiation. This is because, if the single crystal semiconductor film is completely melted, it is microcrystallized due to disordered nucleation after being in a liquid phase, so that crystallinity of the single crystal semiconductor film is highly likely to decrease. On the other hand, by partial melting, crystal growth proceeds from a solid-phase part, which is not melted. Accordingly, defects in the semiconductor film can be reduced. Note that "complete melting" here refers to that the single crystal semiconductor film is melted up to the vicinity of the lower interface of the single crystal semiconductor film to be made in a liquid state. On the other hand, "partial melting" in this case refers to that the upper part of the single crystal semiconductor film is melted to be made in a liquid phase whereas the lower part thereof is kept in a solid phase without being melted.

A pulsed laser is preferably used for the above-described laser light irradiation because pulsed laser light with high energy can be emitted instantaneously and the partially melted state can be easily generated. The repetition rate is preferably about greater than or equal to 1 Hz and less than or equal to 10 MHz.

After the above-described laser light irradiation, a step of reducing the thickness of the single crystal semiconductor film may be performed. For the reduction of the thickness of the single crystal semiconductor film, etching treatment (etch-back treatment) of either dry etching or wet etching, or a combination thereof may be employed. For example, when the single crystal semiconductor film is a layer formed using a silicon material, the thickness thereof can be reduced by dry etching using $SF_6$ and $O_2$ as process gases.

Note that for example, an amorphous semiconductor film is formed over the first SOI substrate 100' which has been separated and the amorphous semiconductor film is subjected to solid phase growth or the like, so that a single crystal semiconductor film is formed anew, whereby the first SOI substrate 100' can be reused as the SOI substrate including the third single crystal semiconductor film 108 shown in FIG. 1H.

The method for manufacturing an SOI substrate described in this embodiment mode can be appropriately combined with the manufacturing methods described in other embodiment modes of this specification.

Embodiment Mode 2

In this embodiment mode, a method for manufacturing an SOI substrate which is different from that described in the above embodiment modes will be described with reference to drawings. Specifically, a method which is different from that in the above embodiment modes will be described as for a method in which a semiconductor film is formed over a second single crystal semiconductor film and the semiconductor film is epitaxially grown (gas phase grown) at the same time as its deposition to form a third single crystal semiconductor film.

By formation of a semiconductor film (e.g., a silicon film) over a single crystal semiconductor film (e.g., a single crystal silicon film) by a CVD method under predetermined conditions, the semiconductor film to be formed can be epitaxially grown (gas phase grown) using the single crystal silicon film as a seed layer at the same time as its deposition.

Figure 2A:
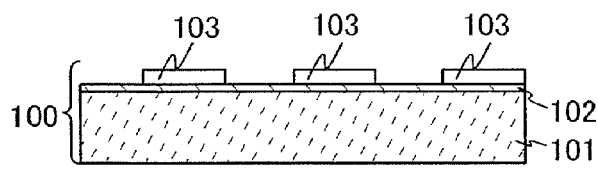
FIGS. 2A to 2K are diagrams showing an example of a method for manufacturing an SOI substrate.
Figure 2B:
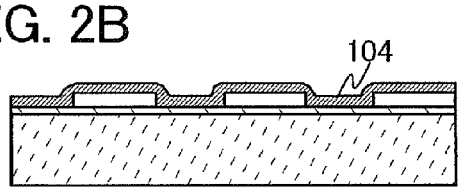
Figure 2C:
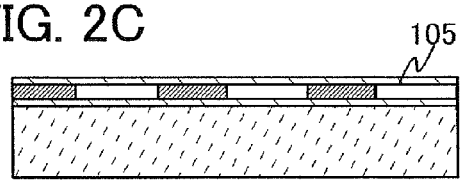
Figure 2D:
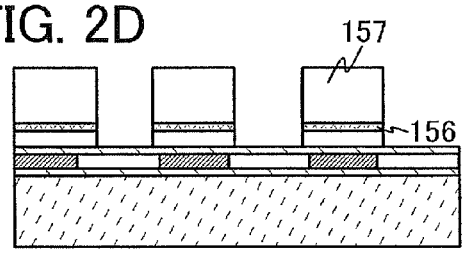
Figure 2E:
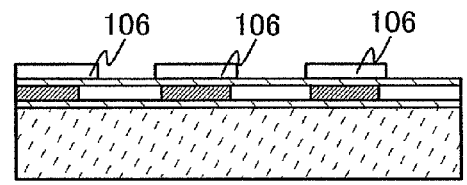
Figure 2F:
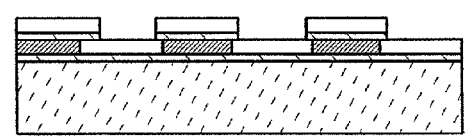
Figure 2G:
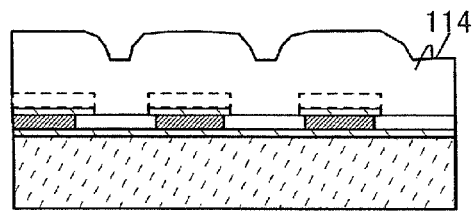

For example, after the above-described steps of FIGS. 1A to 1F are performed, a semiconductor film is formed over the second single crystal semiconductor films 106 by a CVD method under predetermined conditions. Thus, the semiconductor film is formed over the first single crystal semiconductor films 103 and the second single crystal semiconductor films 106 which are formed over the first SOI substrate 100 while the semiconductor film is epitaxially grown (gas phase grown), so that a third single crystal semiconductor film 114 can be formed (see FIG. 2G).

Note that a plasma CVD method is performed under the same conditions as those for forming a microcrystal semiconductor film. Specifically, a plasma CVD method is performed under such conditions where the flow rate of a hydrogen gas is 50 times or more, preferably 100 times or more, as large as that of a silane gas under an atmosphere containing silane and hydrogen.

Figure 2H:
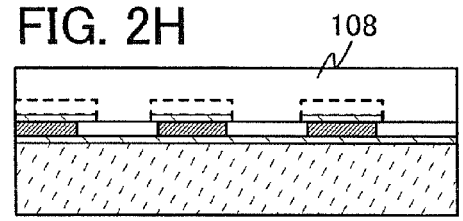
Figure 2I:
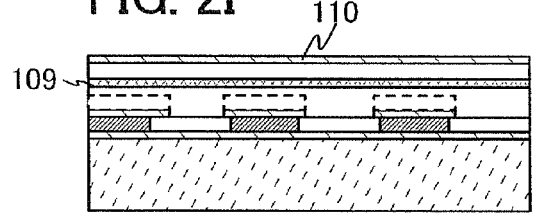
Figure 2J:
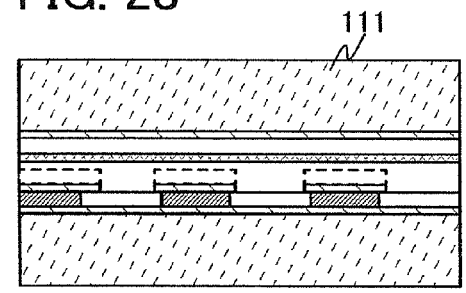
Figure 2K:
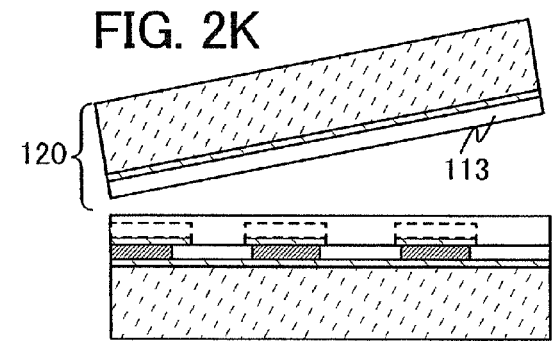

Next, planarization treatment is performed on a surface of the third single crystal semiconductor film 114 (see FIG. 2H). As the planarization treatment, chemical mechanical polishing (CMP), etching treatment, laser light irradiation, or the like can be performed. By planarization treatment performed under such conditions, the semiconductor film can be epitaxially grown at the same time as its deposition.

Note that the steps of FIGS. 2A to 2F and FIGS. 2I to 2K may be performed similarly to the above-described steps shown in FIGS. 1A to 1F and FIGS. 1I to 1K.

Note that the method for manufacturing an SOI substrate described in this embodiment mode can be appropriately combined with the manufacturing methods described in other embodiment modes of this specification.

Embodiment Mode 3

In this embodiment mode, a method for manufacturing an SOI substrate in which a plurality of large-sized single crystal semiconductor films is formed using an SOI substrate manufactured in accordance with the methods described in the above embodiment modes and a method for utilization of the SOI substrate in this case will be described with reference to drawings.

Figure 3A:
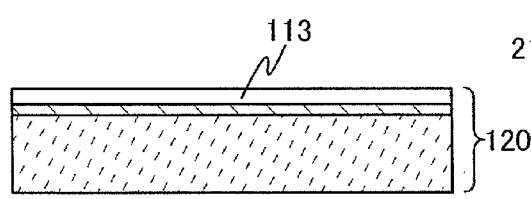
FIGS. 3A to 3F are diagrams showing an example of a method for manufacturing an SOI substrate.

First, the second SOI substrate 120 manufactured in accordance with the methods described in the above embodiment modes is prepared (see FIG. 3A). In this embodiment mode, this second SOI substrate 120 is used as a separation substrate.

Figure 3B:
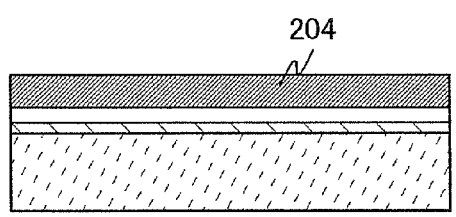

Next, a semiconductor film 204 is formed over the second SOI substrate 120 (see FIG. 3B). As the semiconductor film 204, a silicon film can be formed to a thickness of 20 nm to 1000 nm by a CVD method or the like. In this embodiment mode, an amorphous semiconductor film (e.g., an amorphous silicon film) is formed to a thickness of 20 nm to 250 nm over the single crystal semiconductor film 113. The thickness of the semiconductor film 204 may be set as appropriate in accordance with the thickness of the single crystal semiconductor film 113. The semiconductor film 204 may be formed by applying a liquid material containing a semiconductor material by a spin coating method, an inkjet method, or the like and solidifying the liquid material through heat treatment.

Figure 3C:
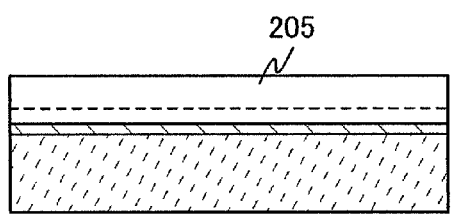

Next, heat treatment is performed to epitaxially grow (solid phase grow) the semiconductor film 204 formed over the single crystal semiconductor film 113 and crystallize it. Accordingly, a single crystal semiconductor film 205 is formed (see FIG. 3C). Note that the single crystal semiconductor film 205 may be formed over the single crystal semiconductor film 113 by epitaxially growing the semiconductor film at the same time as its deposition through the method described in Embodiment Mode 2.

For the heat treatment, a heating furnace, laser irradiation, rapid thermal annealing (RTA), or a combination thereof can be used. For example, after the semiconductor film 204 is formed over the single crystal semiconductor film 113, heat treatment is performed by RTA at 500° C. to 800° C. for 5 sec to 180 sec, whereby the semiconductor film 204 formed over the single crystal semiconductor film 113 can be crystallized.

Note that before the heat treatment or after the heat treatment, planarization treatment is preferably performed on a surface of the second SOI substrate 120. In the case where the surface of the second SOI substrate 120 is flat, the planarization treatment can be omitted. In this case, even in the case where a surface of the single crystal semiconductor film 113 has unevenness, unevenness of a surface of the single crystal semiconductor film 205 (the crystallized semiconductor film 204) which is formed over the single crystal semiconductor film 113 is reduced to be flat in comparison with the surface of the single crystal semiconductor film 113.

Figure 3D:
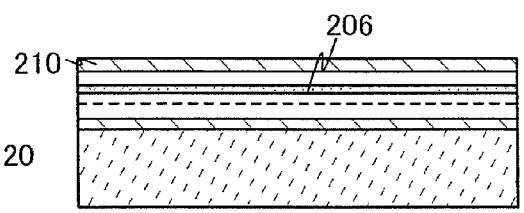

Next, a fragile layer 206 is formed in such a manner that the surface of the single crystal semiconductor film 205 is irradiated with an ion beam including ions accelerated by an electric field to introduce the ions into a region at a predetermined depth (see FIG. 3D). A source gas is excited to generate plasma of the source gas, and then ions included in the plasma are extracted by an effect of an electric field, whereby the ion beam is generated. The fragile layer 206 can be formed by a method similar to the method for forming the fragile layer 156 in the single crystal semiconductor substrate 157, which is described in Embodiment Mode 1.

After formation of the fragile layer 206, an insulating film 210 functioning as a bonding layer is formed over the single crystal semiconductor film 205. The insulating film 210 functions as a layer which is bonded to a separation substrate (a bonding layer) and can be a silicon oxide film or a silicon oxynitride film formed by a CVD method, a sputtering method, or the like. In addition, since the insulating film 210 functions as a bonding layer, its surface is preferably flat. Here, a silicon oxide layer which is deposited by a CVD method using organosilane as a source gas is used. Alternatively, a silicon oxide layer or a silicon oxynitride layer which is deposited by a CVD method using silane as a source gas can be used.

Figure 3E:
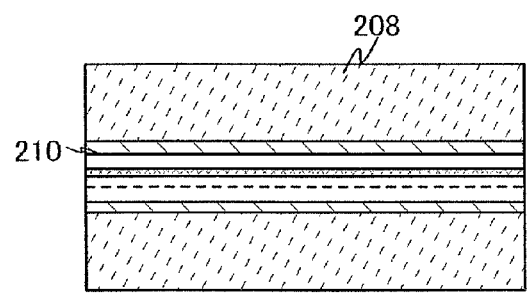

Next, a surface of the insulating film 210 formed over the second SOI substrate 120 and a surface of a third substrate 208 are made to face each other, so that the surface of the insulating film 210 which functions as a bonding layer and the surface of the third substrate 208 are bonded to each other (see FIG. 3E). The surface of the insulating film 210 formed over the second SOI substrate 120 and the surface of the third substrate 208 are disposed in close contact with each other, so that a bond is formed. This bond is formed under the action of a van der Waals force, and by pressure bonding of the second SOI substrate 120 and the third substrate 208, a strong bond can be formed by hydrogen bonding using Si—H and Si—OH bonds, and the like.

It is preferable that a substrate made of the same material as the second substrate 111 included in the second SOI substrate 120 be used as the third substrate 208. For example, a glass substrate can be used as the second substrate 111 and the third substrate 208. In addition, here, the second SOI substrate 120 serves as a separation substrate, and the third substrate 208 serves as a substrate to be separated.

The use of a substrate made of the same material as the second substrate 111 as the third substrate 208 makes it possible to reduce the difference in thermal expansion between the substrates and the difference in contraction due to heat treatment between the substrates, even when the heat treatment is performed after the second SOI substrate 120 and the third substrate 208 are bonded to each other. Accordingly, occurrence of defective bonding can be suppressed.

Note that it is preferable that a bonding plane be cleaned by megasonic cleaning, or by megasonic cleaning and cleaning with ozone water before the second SOI substrate 120 and the third substrate 208 are bonded to each other. With such treatment, dust such as an organic substance on the bonding plane can be removed and the surfaces can be made hydrophilic.

Figure 3F:
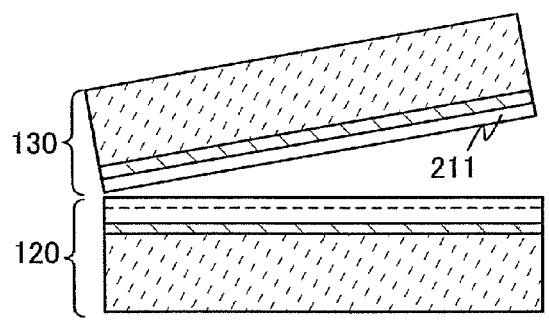

Next, heat treatment is performed to make separation (cleavage) occur at the fragile layer 206, so that a part of the crystallized semiconductor film (the single crystal semiconductor film 205) is separated and is fixed to the third substrate 208 (see FIG. 3F). Here, by heat treatment at 400° C. to 700° C., a change in the volume of microvoids of ions (e.g., hydrogen ions) included in the fragile layer 206 occurs, which enables cleavage to occur along the fragile layer 206. Accordingly, a single crystal semiconductor film 211 (a part of the single crystal semiconductor film 205) is formed on the third substrate 208 with the insulating film 210 interposed therebetween, while the single crystal semiconductor film 205 which has not been separated remains over the second SOI substrate 120.

Through the above-described steps, a third SOI substrate 130 can be formed in which the single crystal semiconductor film 211 is formed on the third substrate 208 with the insulating film 210 interposed therebetween. After that, the second SOI substrate is used as an SOI substrate for manufacturing a semiconductor element such as a transistor. In addition, the third SOI substrate can be used as an SOI substrate for separation shown in FIG. 3A. That is, in this embodiment mode, a manufactured SOI substrate is once used as an SOI substrate for separation, and the SOI substrate used as the SOI substrate for separation is used as an SOI substrate for manufacturing a semiconductor element such as a transistor.

By manufacture of an SOI substrate by the method shown in FIGS. 3A to 3F, a separation substrate does not need to be reused over and over again. Accordingly, damage of the separation substrate due to reduction in thickness or the like and decline in the quality of the SOI substrate which is accompanied with decline in the quality of the separation substrate can be suppressed. Moreover, the anew-manufactured SOI substrate is used as the substrate for manufacturing a semiconductor element after once being used as the separation substrate, so that quality differences between a plurality of SOI substrates can be reduced when manufacturing the plurality of SOI substrates.

In particular, when a glass substrate with low heat resistance or the like is used as the separation substrate, defective bonding might occur due to change in the characteristics of the substrate due to heat treatment performed several times due to repeated reuse of the separation substrate. However, occurrence of defective bonding accompanied with change in the characteristics of the substrate can be reduced as long as the heat treatment is performed only several times (preferably once).

In addition, if 50 SOI substrates each including a single crystal semiconductor film are formed over a non-semiconductor substrate (e.g., a glass substrate), a single crystal semiconductor substrate needs to be used as a separation substrate for manufacturing all the SOI substrates. Thus, defective bonding is highly likely to occur due to the difference in the characteristics between the separation substrate and a substrate to be separated and yield might be reduced. On the other hand, in the method for manufacturing an SOI substrate of this embodiment mode, a substrate made of the same material as a separation substrate can be favorably used as a substrate to be separated when manufacturing the third SOI substrate and SOI substrates after that. Accordingly, occurrence of defective bonding can be reduced and yield can be improved.

Note that the method for manufacturing an SOI substrate described in this embodiment mode can be appropriately combined with the manufacturing methods described in other embodiment modes of this specification.

Embodiment Mode 4

In the above embodiment mode, an example of using an SOI substrate having the plurality of first single crystal semiconductor films 103 arranged in a line as the first SOI substrate 100 is described. In this embodiment mode, a method for manufacturing an SOI substrate having a large-sized single crystal semiconductor film using an SOI substrate having first single crystal semiconductor films arranged in plural lines as a first SOI substrate will be described with reference to drawings.

Figure 4A:
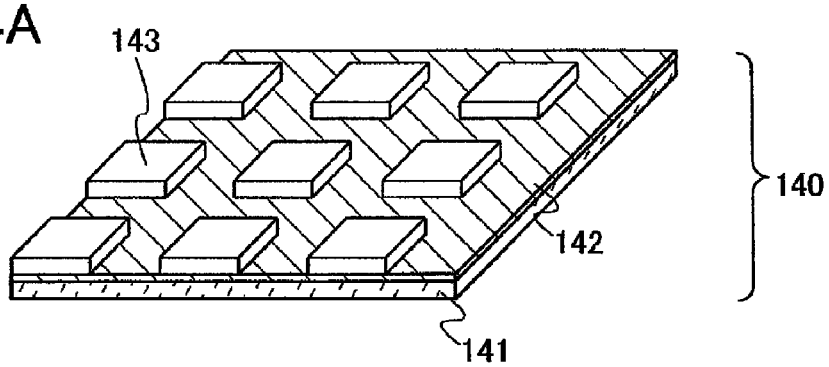
FIGS. 4A to 4D are diagrams showing an example of a method for manufacturing an SOI substrate.

First, a first SOI substrate 140 is prepared (see FIG. 4A).

In the first SOI substrate 140, a first single crystal semiconductor film 143 can be provided over a first substrate 141 with an insulating film 142 interposed therebetween. The same materials as the first substrate 101 and the insulating film 102, which are described in Embodiment Mode 1 can be used for the first substrate 141 and the insulating film 142, respectively.

The first single crystal semiconductor film 143 can be formed using a single crystal silicon film or the like. Here, a single crystal semiconductor film is formed by attaching a single crystal semiconductor substrate such as a silicon wafer and separating it. In this embodiment mode, the first single crystal semiconductor films 143 which are separated from a plurality of single crystal semiconductor substrates are arranged in plural lines in longitudinal and lateral directions. In addition, the first single crystal semiconductor films 143 do not need to be provided without gaps between them. For example, the first single crystal semiconductor films 143 are provided at intervals greater than or equal to about 200 μm and less than or equal to a width of the single crystal semiconductor substrate. Note that it is preferable that the first single crystal semiconductor films 143 be each formed to a thickness of 20 nm to 250 nm. In addition, it is preferable that intervals between the first single crystal semiconductor films 143 be widened because the number of the single crystal semiconductor substrates used for forming the first single crystal semiconductor films 143 can be saved.

Figure 4B:
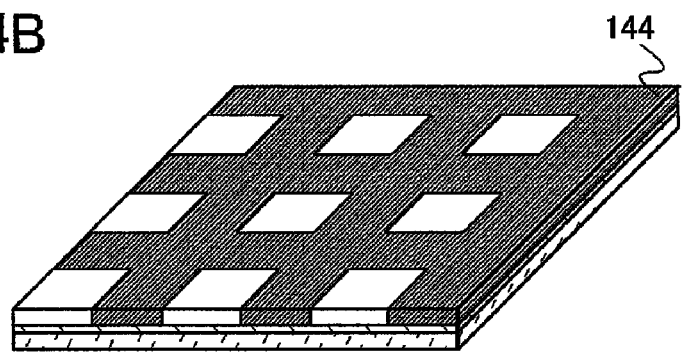

Next, a semiconductor film 144 is formed over the first single crystal semiconductor films 143 in a manner similar to a step shown in FIG. 1B, and then planarization treatment is performed on a surface of the semiconductor film 144, whereby the first single crystal semiconductor films 143 are each exposed (see FIG. 4B).

Then, the insulating film 105 which functions as a bonding layer is formed over the first single crystal semiconductor films 143 and the semiconductor film 144 in a manner similar to a step shown in FIG. 1C. Note that without formation of the semiconductor film 144, the insulating film 105 is deposited over the first single crystal semiconductor films 143 so as to cover the first substrate, so that the gaps between the first single crystal semiconductor films 143 which are provided at intervals may be filled, and after that, planarization treatment may be performed on the insulating film 105.

Figure 4C:
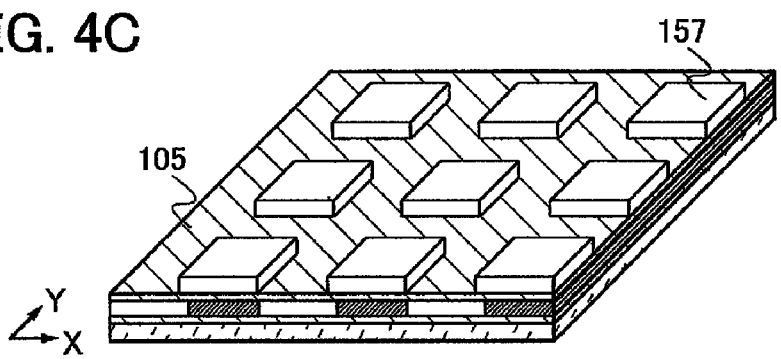

Next, the plurality of single crystal semiconductor substrates 157 in each of which a fragile layer (not shown in drawings) is formed at a predetermined depth from the surface thereof is prepared, and surfaces of the single crystal semiconductor substrates 157 are each superposed on the insulating film 105 which functions as a bonding layer (see FIG. 4C). In this embodiment mode, there are intervals between the first single crystal semiconductor films 143 in two directions of the X-axis direction and the Y-axis direction because the first single crystal semiconductor films 143 are arranged in plural lines in longitudinal and lateral directions. In the step shown in FIG. 4C, the single crystal semiconductor substrates 157 are provided over the insulating film 105 such that either or both of the first single crystal semiconductor films 143 or/and the single crystal semiconductor substrates 157 are superimposed over the first substrate 141 at the intervals between the first single crystal semiconductor films 143 in one direction (e.g., the X-axis direction).

Figure 4D:
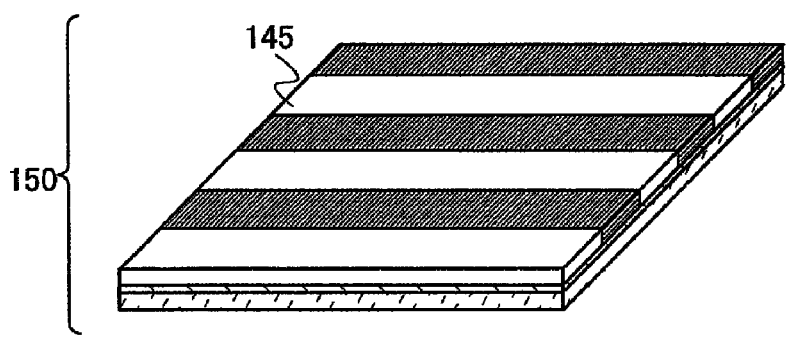

Next, through the steps shown in FIGS. 1E to 1K, an SOI substrate 150 in which a plurality of single crystal semiconductor films 145 is arranged in stripes can be formed (see FIG. 4D). With the use of the SOI substrate 150 which is formed as the first SOI substrate, the steps shown in FIGS. 1A to 1K are repeated, so that an SOI substrate having a large-sized single crystal semiconductor film which has almost no joint portions can be manufactured.

In this embodiment mode, the thickness of the semiconductor film to be single-crystallized by solid phase growth is, for example, 20 nm to 1000 nm. Thus, heat treatment time can be much shorter than the case in which the semiconductor film formed in the gap of about 200 μm is single-crystallized by lateral growth. Further, since the heat treatment time is short, a glass substrate with low heat resistance can be used as a supporting substrate.

Embodiment Mode 5

In this embodiment mode, a method for manufacturing a semiconductor device using the SOI substrate manufactured in either one of the above embodiment modes will be described.

First, as a method for manufacturing a semiconductor device, a method for manufacturing an n-channel thin film transistor and a p-channel thin film transistor is described with reference to FIGS. 5A to 5D and FIGS. 6A to 6C. By combining a plurality of thin film transistors (TFTs), various types of semiconductor devices can be formed.

Figure 5A:
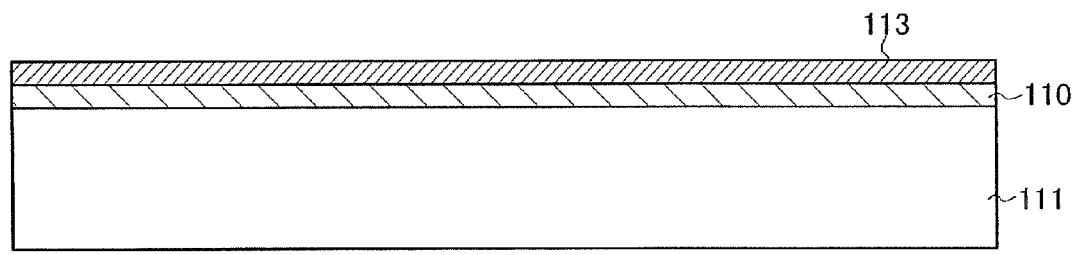
FIGS. 5A to 5D are diagrams showing an example of a method for manufacturing a semiconductor device using an SOI substrate.

FIG. 5A is a cross-sectional view of the SOI substrate manufactured by the method described in the above embodiment mode. As an SOI substrate, for example, the second SOI substrate 120 manufactured by the method of Embodiment Mode 1 is used in this embodiment mode.

Figure 5B:
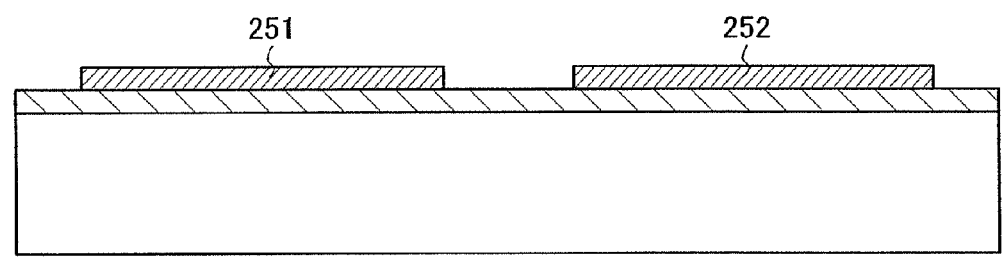

By element isolation of the single crystal semiconductor film 113 of the SOI substrate by etching, semiconductor films 251 and 252 are formed as shown in FIG. 5B. The semiconductor film 251 is used for forming an n-channel TFT, and the semiconductor film 252 is used for forming a p-channel TFT.

Figure 5C:
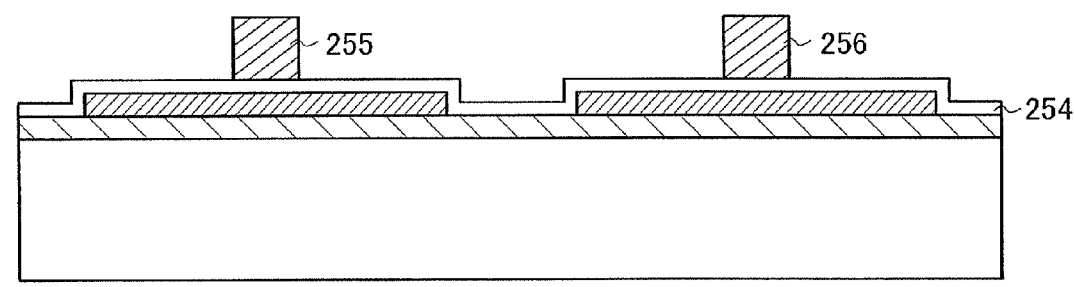

As shown in FIG. 5C, an insulating film 254 is formed over the semiconductor films 251 and 252. Next, gate electrodes 255 and 256 are formed over the semiconductor films 251 and 252 respectively with the insulating film 254 interposed therebetween.

Note that before the single crystal semiconductor film 113 are etched, it is preferable to add an impurity element which serves as an acceptor, such as boron, aluminum, or gallium, or an impurity element which serves as a donor, such as phosphorus or arsenic, to the single crystal semiconductor film 113 in order to control the threshold voltage of the TFTs. For example, an acceptor is added to a region where an n-channel TFT is to be formed, and a donor is added to a region where a p-channel TFT is to be formed.

Figure 5D:
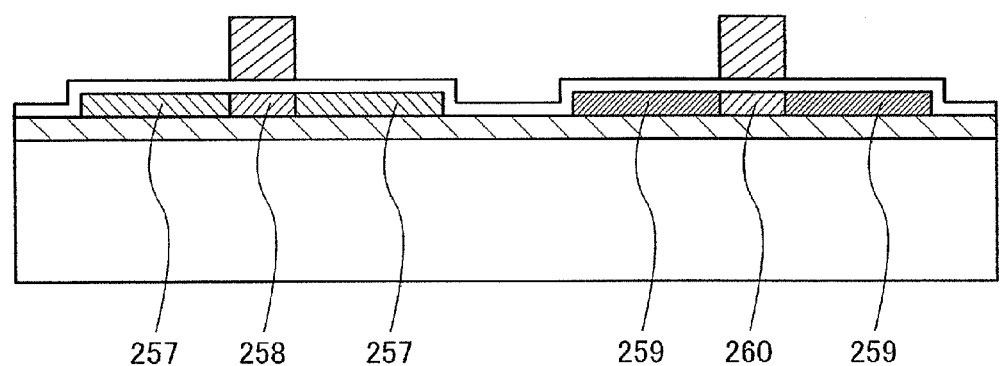

Next, as shown in FIG. 5D, n-type low-concentration impurity regions 257 are formed in the semiconductor film 251, and p-type high-concentration impurity regions 259 are formed in the semiconductor film 252. First, the n-type low-concentration impurity regions 257 are formed in the semiconductor film 251. In order to form the n-type low-concentration impurity regions 257, the semiconductor film 252 where a p-channel TFT is to be formed is covered with a resist mask, and a donor is added to the semiconductor film 251. As the donor, phosphorus or arsenic may be added. When the donor is added by an ion doping method or an ion implantation method, the gate electrode 255 serves as a mask, and the n-type low-concentration impurity regions 257 are formed in the semiconductor film 251 in a self-aligned manner. A region of the semiconductor film 251 over which the gate electrode 255 is superimposed serves as a channel formation region 258.

Next, after the mask which covers the semiconductor film 252 is removed, the semiconductor film 251 where an n-channel TFT is to be formed is covered with a resist mask. Then, an acceptor is added to the semiconductor film 252 by an ion doping method or an ion implantation method. As the acceptor, boron can be added. In the step of adding the acceptor, the gate electrode 256 serves as a mask, and the p-type high-concentration impurity regions 259 are formed in the semiconductor film 252 in a self-aligned manner. The high-concentration impurity regions 259 function as a source region and a drain region. A region of the semiconductor film 252 over which the gate electrode 256 is superimposed serves as a channel formation region 260. Here, the method is described in which the p-type high-concentration impurity regions 259 are formed after the n-type low-concentration impurity regions 257 are formed; however, the p-type high-concentration impurity regions 259 can be formed first.

Figure 6A:
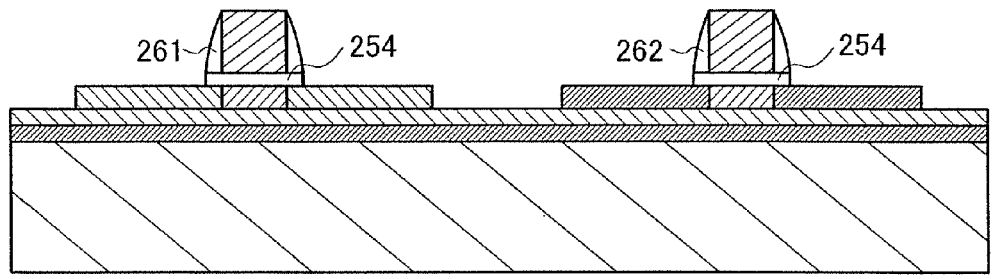
FIGS. 6A to 6C are diagrams showing an example of a method for manufacturing a semiconductor device using an SOI substrate.

Next, after the resist that covers the semiconductor film 251 is removed, an insulating film having a single layer structure or a stacked layer structure, which includes a nitrogen compound such as silicon nitride or an oxide such as silicon oxide, is formed by a plasma CVD method or the like. This insulating film is anisotropically etched in a perpendicular direction, whereby sidewall insulating films 261 and 262 are formed in contact with side surfaces of the gate electrodes 255 and 256 respectively, as shown in FIG. 6A. By this anisotropic etching, the insulating film 254 is also etched.

Figure 6B:
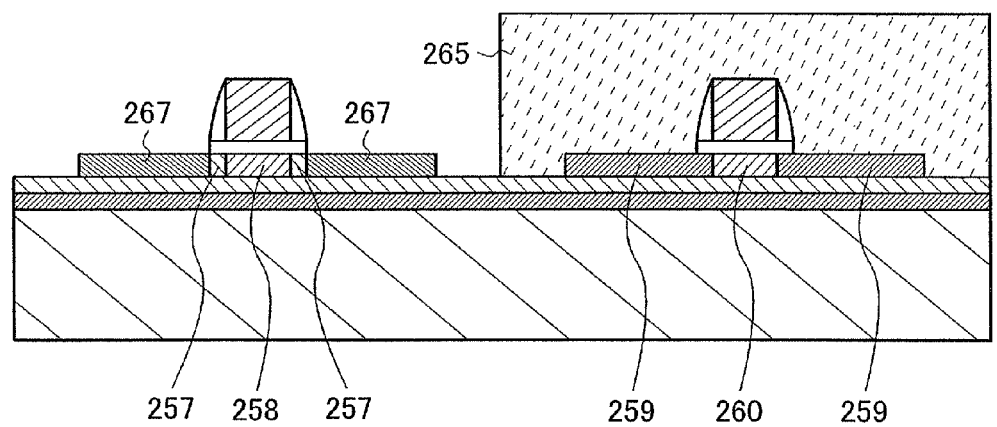

Next, as shown in FIG. 6B, the semiconductor film 252 is covered with a resist 265. In order to form high-concentration impurity regions functioning as a source region and a drain region in the semiconductor film 251, a donor is added to the semiconductor film 251 at high dosage by an ion implantation method or an ion doping method. The gate electrode 255 and the sidewall insulating film 261 function as masks, and n-type high-concentration impurity regions 267 are formed. Next, heat treatment for activating the donors and the acceptors is performed.

Figure 6C:
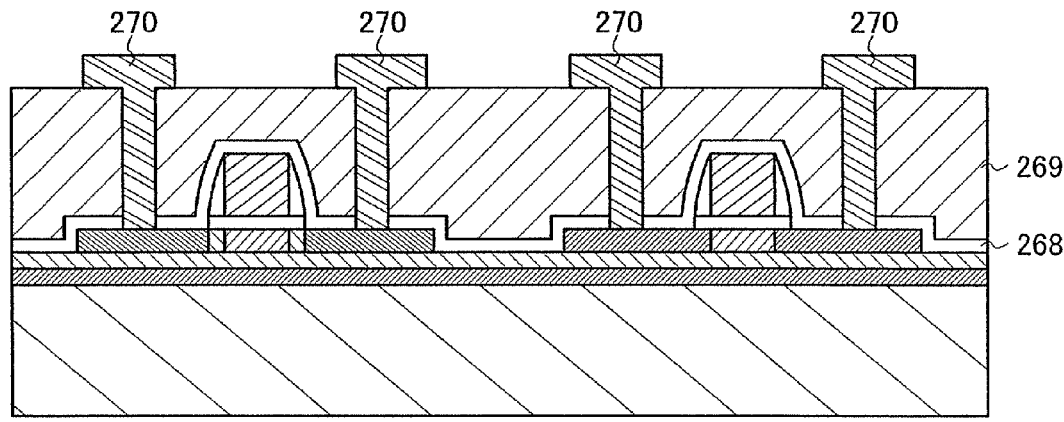

After the heat treatment for activation, an insulating film 268 containing hydrogen is formed as shown in FIG. 6C. After the insulating film 268 is formed, heat treatment is performed at a temperature of 350° C. to 450° C. inclusive so that hydrogen contained in the insulating film 268 diffuses into the semiconductor films 251 and 252. The insulating film 268 can be formed by deposition of silicon nitride or silicon nitride oxide by a plasma CVD method at a process temperature of 350° C. or lower. By supply of hydrogen to the semiconductor films 251 and 252, defects serving as trapping centers in the semiconductor films 251 and 252 or at the interface with the insulating film 254 can be compensated effectively.

After that, an interlayer insulating film 269 is formed. The interlayer insulating film 269 can be formed using a film having a single layer structure or a stacked layer structure selected from insulating films formed using inorganic materials, such as a silicon oxide film and a borophosphosilicate glass (BPSG) film, and organic resin films formed using polyimide, acrylic, and the like. Contact holes are formed in the interlayer insulating film 269, and wirings 270 are then formed as shown in FIG. 6C. The wirings 270 can be formed using a conductive film with a three-layer structure in which a low-resistance metal film such as an aluminum film or an aluminum-alloy film is sandwiched between barrier metal films. The barrier metal films can each be formed using a metal film of molybdenum, chromium, titanium, or the like.

Through the above-described steps, a semiconductor device having the n-channel TFT and the p-channel TFT can be manufactured. Because the metal element concentration of the semiconductor film in which the channel formation region is formed is reduced in the manufacturing process of the SOI substrate, a TFT in which off current is small and variation of the threshold voltage is suppressed can be manufactured.

Although the method for manufacturing a TFT is described with reference to FIGS. 5A to 5D and FIGS. 6A to 6C, a semiconductor device with high added value can be manufactured by forming a variety of semiconductor elements such as a capacitor and a resistor as well as a TFT. Hereinafter, specific modes of semiconductor devices will be described with reference to drawings.

Figure 7:
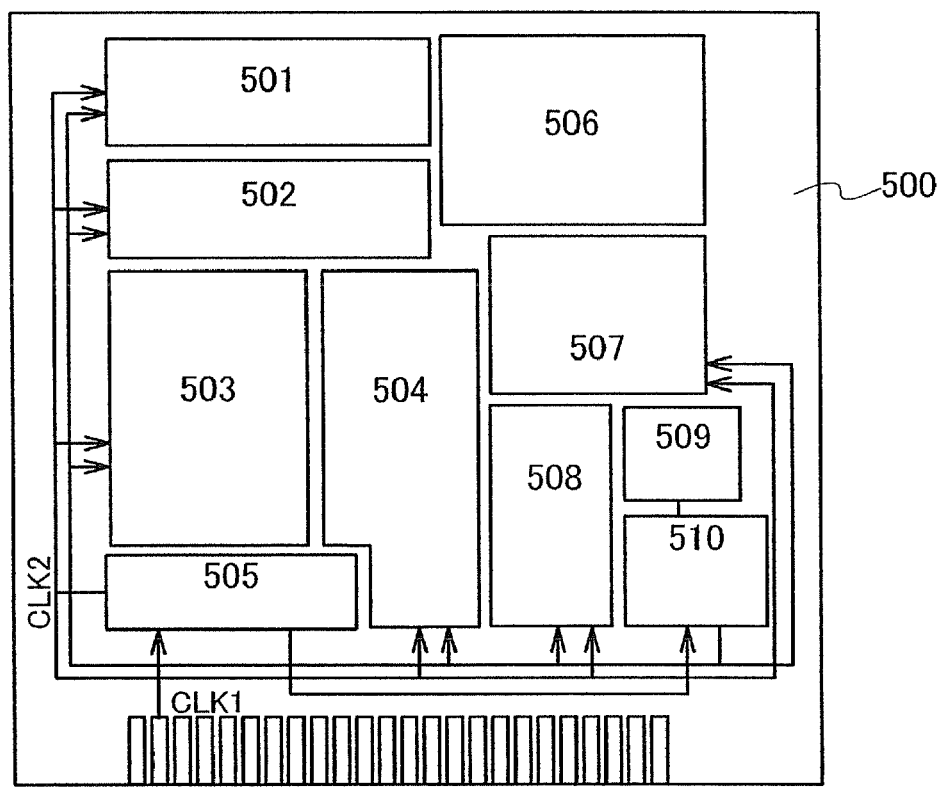
FIG. 7 is a diagram showing an example of a semiconductor device using an SOI substrate.

First, as an example of the semiconductor device, a microprocessor will be described. FIG. 7 is a block diagram showing a structural example of a microprocessor 500.

This microprocessor 500 has an arithmetic logic unit (ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. While the microprocessor 500 is executing a program, the interrupt controller 504 processes an interrupt request from an external input/output device or a peripheral circuit based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As shown in FIG. 7, the internal clock signal CLK2 is input to another circuit.

Figure 8:
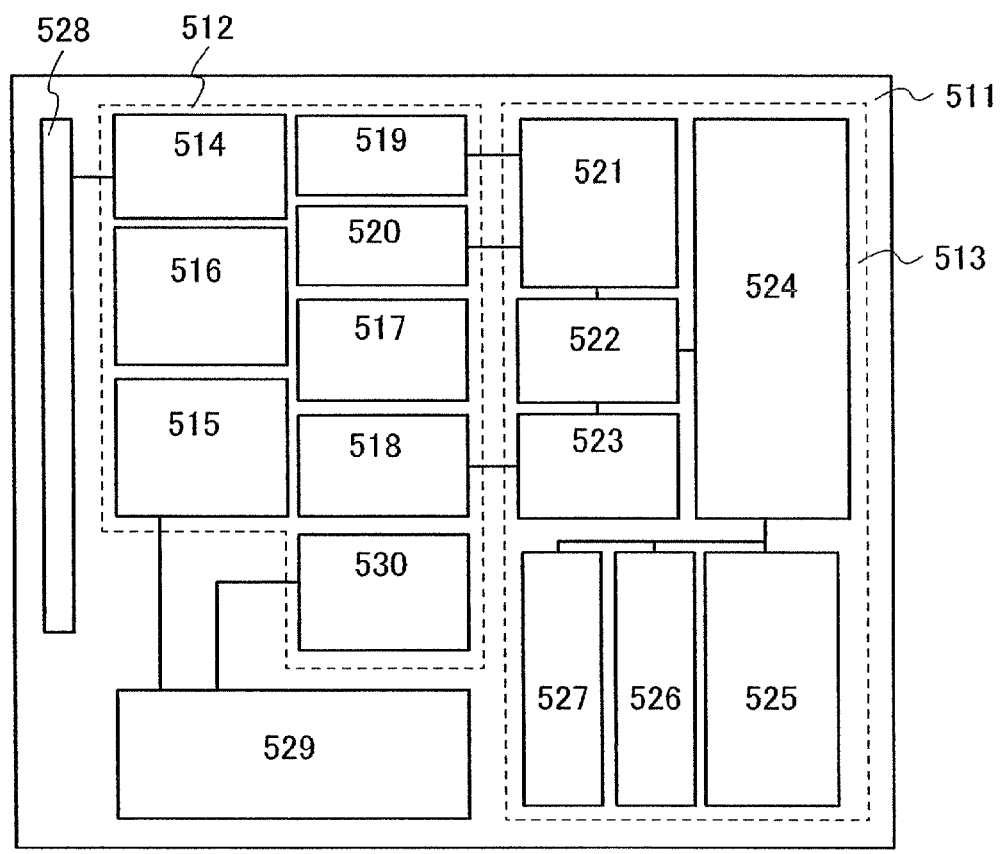
FIG. 8 is a diagram showing an example of a semiconductor device using an SOI substrate.

Next, an example of a semiconductor device provided with a function of transmitting and receiving data without contact and an arithmetic function is described. FIG. 8 is a block diagram showing a structural example of such a semiconductor device. The semiconductor device shown in FIG. 8 can be called a computer (hereinafter referred to as an RFCPU) which operates to transmit and receive signals to and from an external device through wireless communication.

As shown in FIG. 8, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power supply control circuit 530. The digital circuit portion 513 has an RF interface 521, a control register 522, a clock controller 523, a CPU interface 524, a central processing unit 525, a random-access memory 526, and a read-only memory 527.

The operation of the RFCPU 511 is roughly described below. An induced electromotive force is generated by the resonance circuit 514 based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 does not need to be integrated on a substrate which is included in the RFCPU 511 and the capacitor portion 529 can be incorporated into the RFCPU 511 as a different component.

The reset circuit 517 generates a signal for resetting and initializing the digital circuit portion 513. For example, a signal that rises after an increase in power supply voltage is generated as the reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data that is to be transmitted.

The demodulation circuit 519 having a low pass filter, for example, binarizes received signals of an amplitude shift keying (ASK) system based on changes in amplitude of the signals. The modulation circuit 520 transmits transmission data by changing the amplitude of a transmission signal of an amplitude shift keying (ASK) system. The modulation circuit 520 changes the resonance point of the resonance circuit 514, thereby changing the amplitude of a communication signal.

The clock controller 523 generates a control signal for changing the frequency and duty ratio of a clock signal in accordance with the power supply voltage or a consumption current of the central processing unit 525. The power supply voltage is monitored by the power supply control circuit 530.

A signal input from the antenna 528 to the RFCPU 511 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 has a function of generating an access signal for any of the read-only memory 527, the random-access memory 526, and the control register 522 based on an address that the central processing unit 525 requests.

As an arithmetic method of the central processing unit 525, a method may be employed in which an operating system (OS) is stored in the read-only memory 527 and a program is read and executed at the time of starting operation. Alternatively, a method may be employed in which a circuit dedicated to arithmetic is formed as an arithmetic circuit and an arithmetic processing is conducted using hardware. In a method in which both hardware and software are used, part of processing can be conducted by a circuit dedicated to arithmetic, and the other part of the arithmetic processing can be conducted by the central processing unit 525 using a program.

Next, display devices are described as semiconductor devices with reference to FIGS. 9A and 9B and FIGS. 10A and 10B.

Figure 9A:
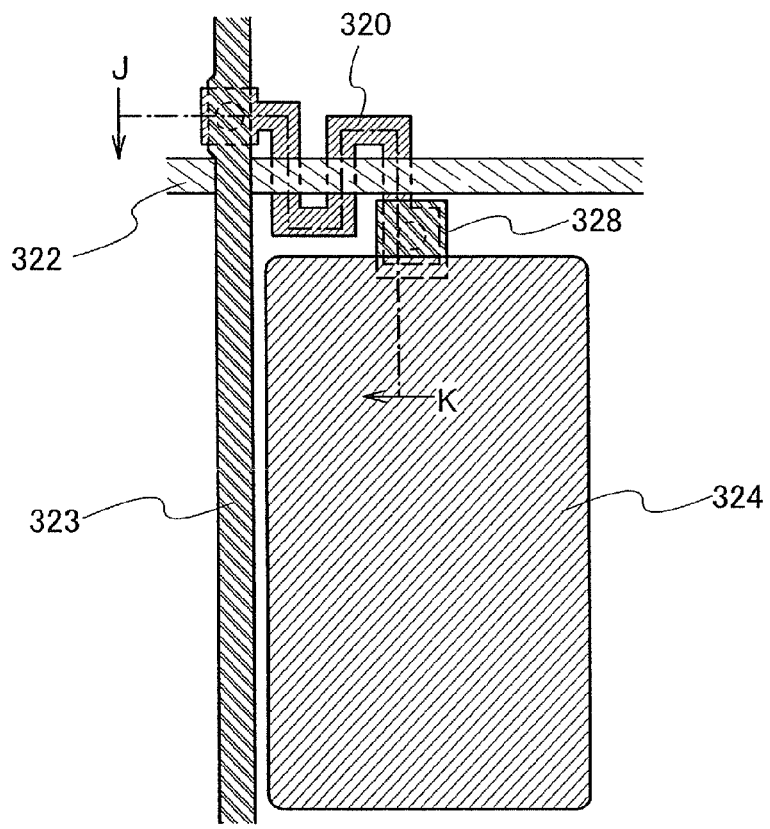
FIGS. 9A and 9B are diagrams showing an example of a display device using an SOI substrate.
Figure 9B:
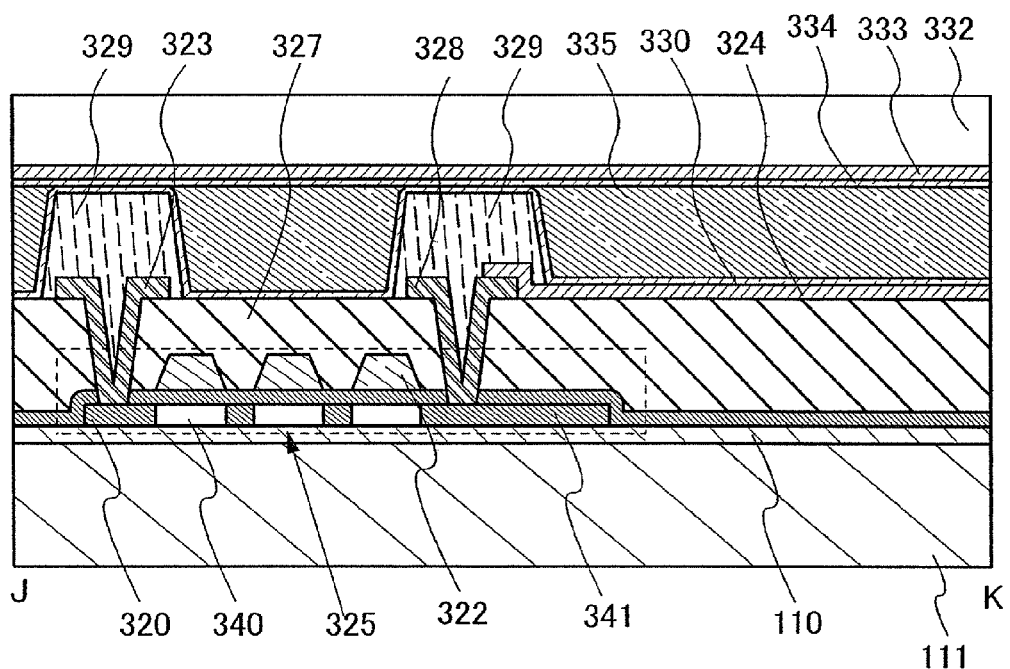

FIGS. 9A and 9B are drawings for describing a liquid crystal display device. FIG. 9A is a plan view of a pixel of the liquid crystal display device, and FIG. 9B is a cross-sectional view of FIG. 9A taken along a section line J-K.

As shown in FIG. 9A, the pixel includes a single crystal semiconductor film 320, a scan line 322 intersecting with the single crystal semiconductor film 320, a signal line 323 intersecting with the scan line 322, a pixel electrode 324, and an electrode 328 which electrically connects the pixel electrode 324 to the single crystal semiconductor film 320. The single crystal semiconductor film 320 is a layer formed using a single crystal semiconductor film 302 bonded to the SOI substrate and is included in a TFT 325 of the pixel.

As the SOI substrate, the SOI substrate described in the above embodiment modes is used. As shown in FIG. 9B, the insulating film 110 and the single crystal semiconductor film 320 are stacked over the second substrate 111. The second substrate 111 is made of glass. The single crystal semiconductor film 320 of the TFT 325 is formed by element isolation of the single crystal semiconductor film 113 of the SOI substrate by etching. In the single crystal semiconductor film 320, channel formation regions 340 and n-type high-concentration impurity regions 341 to which a donor is added are formed. A gate electrode of the TFT 325 is included in the scan line 322, and one of a source electrode and a drain electrode is included in the signal line 323.

The signal line 323, the pixel electrode 324, and the electrode 328 are provided over an interlayer insulating film 327. Further, columnar spacers 329 are formed over the interlayer insulating film 327, and an orientation film 330 is formed covering the signal line 323, the pixel electrode 324, the electrode 328, and the columnar spacers 329. A counter substrate 332 is provided with a counter electrode 333 and an orientation film 334 which covers the counter electrode 333. The columnar spacers 329 are formed to keep gaps between the second substrate 111 and the counter substrate 332. A liquid crystal layer 335 is formed in gaps formed by the columnar spacers 329. The orientation of liquid crystal of the liquid crystal layer 335 is easily disordered at portions where the n-type high-concentration impurity regions 341 are each connected to the signal line 323 and the electrode 328 because steps are generated in the interlayer insulating film 327 by formation of the contact holes. Therefore, the columnar spacers 329 are formed at these step portions to prevent the disorder of the orientation of liquid crystal.

Figure 10A:
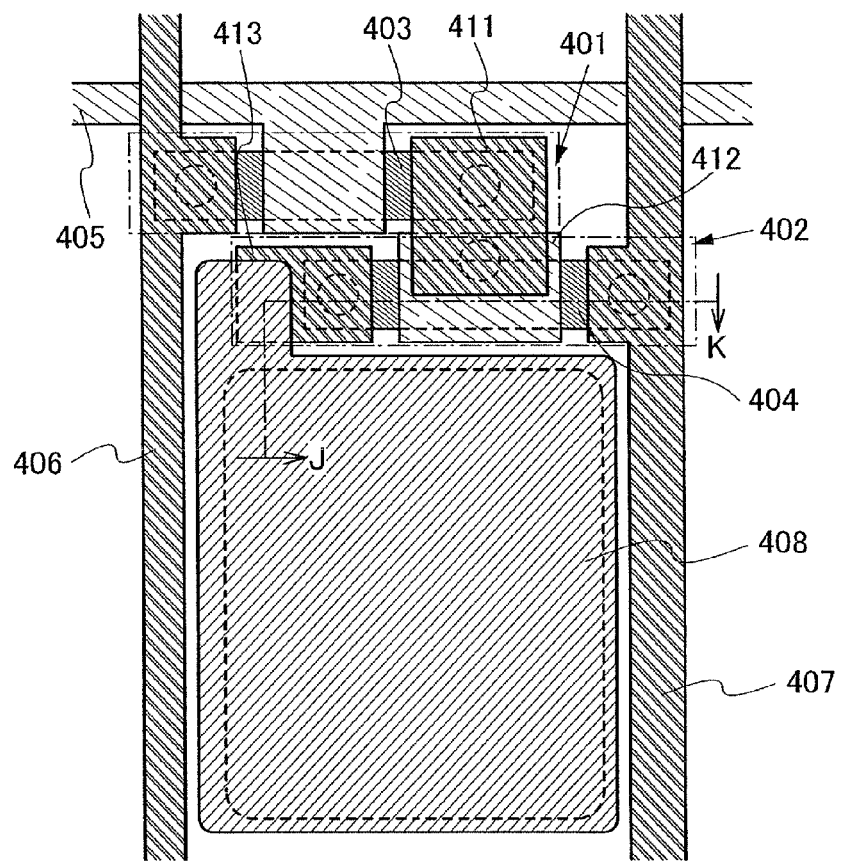
FIGS. 10A and 10B are diagrams showing an example of a display device using an SOI substrate.
Figure 10B:
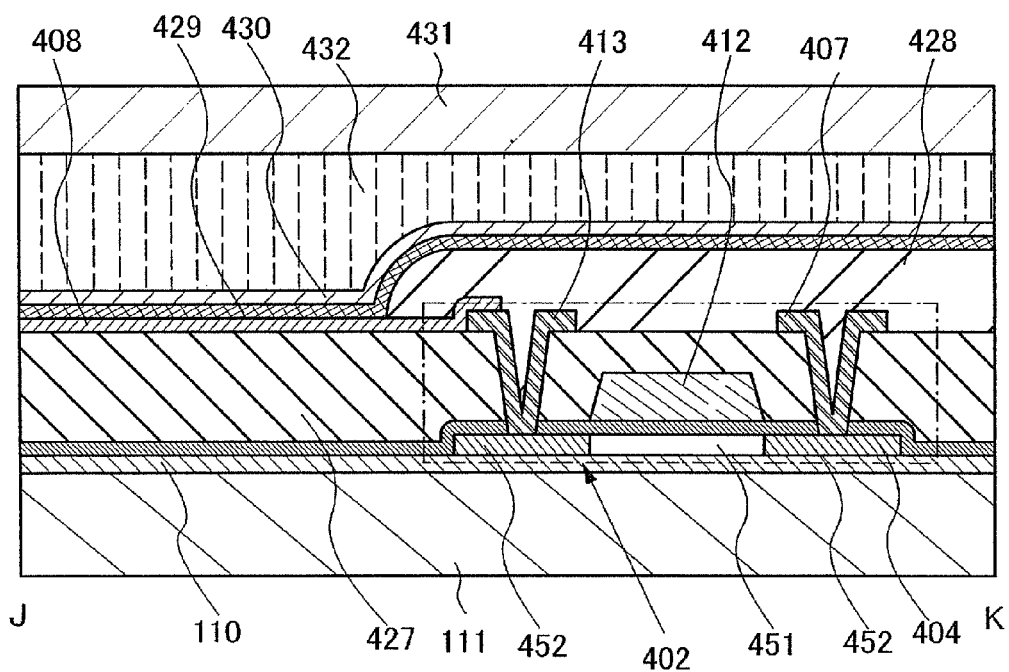

Next, an electroluminescent display device (hereinafter referred to as an EL display device) will be described with reference to FIGS. 10A and 10B. FIG. 10A is a plan view of a pixel of the EL display device, and FIG. 10B is a cross-sectional view of FIG. 10A taken along a section line J-K.

As shown in FIG. 10A, the pixel includes a selection transistor 401 and a display control transistor 402 that are formed using TFTs, a scan line 405, a signal line 406, a current supply line 407, and a pixel electrode 408. Each pixel is provided with a light emitting element having a structure in which a layer containing an electroluminescent material (an EL layer) is sandwiched between a pair of electrodes. One of the electrodes of the light emitting element is the pixel electrode 408. In a semiconductor film 403, a channel formation region, a source region, and a drain region of the selection transistor 401 are formed. In a semiconductor film 404, a channel formation region, a source region, and a drain region of the display control transistor 402 are formed. The semiconductor films 403 and 404 are formed using the single crystal semiconductor film 302 that is bonded to the SOI substrate.

In the selection transistor 401, a gate electrode is included in the scan line 405, one of a source electrode and a drain electrode is included in the signal line 406, and the other thereof is formed as an electrode 410. In the display control transistor 402, a gate electrode 412 is electrically connected to the electrode 411, one of a source electrode and a drain electrode is formed as an electrode 413 which is electrically connected to the pixel electrode 408, and the other thereof is included in the current supply line 407.

The display control transistor 402 is a p-channel TFT. As shown in FIG. 10B, in the semiconductor film 404, a channel formation region 451 and p-type high-concentration impurity regions 452 are formed. Note that as the SOI substrate, the second SOI substrate 120 manufactured by the method of Embodiment Mode 1 is used.

An interlayer insulating film 427 is formed to cover the gate electrode 412 of the display control transistor 402. Over the interlayer insulating film 427, the signal line 406, the current supply line 407, the electrode 411, the electrode 413, and the like are formed. Over the interlayer insulating film 427, the pixel electrode 408 which is electrically connected to the electrode 413 is formed. A peripheral portion of the pixel electrode 408 is surrounded by a partition wall layer 428 having an insulating property. An EL layer 429 is formed over the pixel electrode 408, and a counter electrode 430 is formed over the EL layer 429. A counter substrate 431 is provided as a reinforcing plate, and is fixed to the second substrate 111 by a resin layer 432.

The grayscale of the EL display device is controlled by either a current drive method by which the luminance of the light-emitting element is controlled by the amount of current or a voltage drive method by which the luminance of the light-emitting element is controlled by the amount of voltage. The current drive method is difficult to be employed when transistors have characteristics which are largely different for each pixel, and therefore a compensation circuit for compensating variation in characteristics is necessary. By manufacturing an EL display device through a manufacturing method including a manufacturing process of an SOI substrate and a gettering step, characteristic variation of the selection transistor 401 and the display control transistor 402 between pixels is negligible; therefore, the current driving method can be employed.

That is, by using the SOI substrate, various electronic devices can be manufactured. The electronic devices include video cameras, digital cameras, navigation systems, audio reproducing devices (such as car audios or audio components), computers, game machines, portable information terminals (such as mobile computers, mobile phones, portable game machines, or electronic books), image reproducing devices provided with a recording medium (specifically, devices that can reproduce audio data recorded in a recording medium such as a digital versatile disk (DVD) and are equipped with a display device capable of displaying the image data), and the like.

Figure 11A:
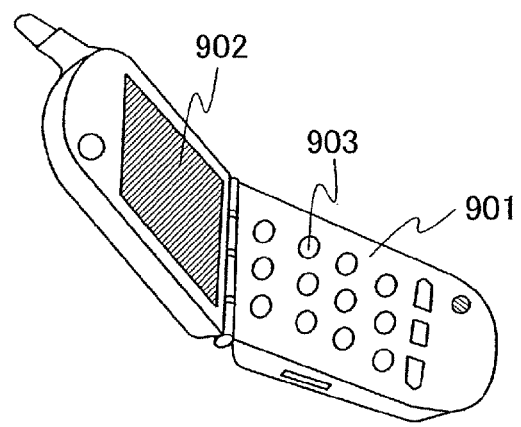
FIGS. 11A to 11C are diagrams each showing an electronic device using an SOI substrate.
Figure 11B:
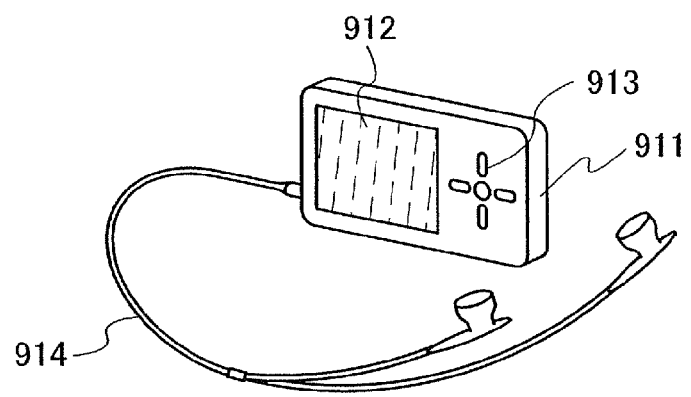
Figure 11C:
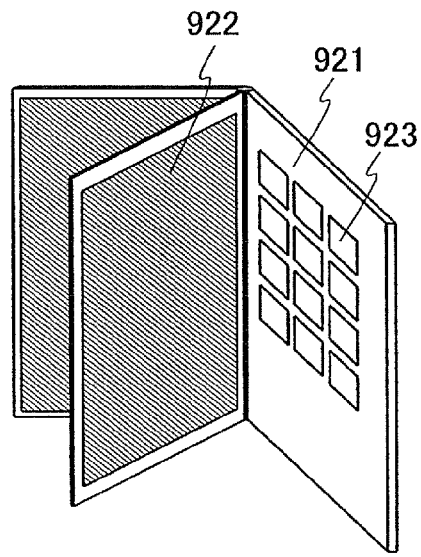

With reference to FIGS. 11A to 11C, specific modes of the electronic devices are described. FIG. 11A is an external view showing an example of a mobile phone 901. This mobile phone 901 includes a display portion 902, operation switches 903, and the like. By applying the liquid crystal display device shown in FIGS. 9A and 9B or the EL display device shown in FIGS. 10A and 10B to the display portion 902, the display portion 902 can have little display unevenness and excellent image quality.

FIG. 11B is an external view of a digital player 911. The digital player 911 includes a display portion 912, an operation portion 913, an earphone 914, and the like. Instead of the earphone 914, a headphone or a wireless earphone can be used. By applying the liquid crystal display device shown in FIGS. 9A and 9B or the EL display device shown in FIGS. 10A and 10B to the display portion 912, a high-resolution image and much character information can be displayed even in the case where the size of an image area is about 0.3 inches to 2 inches.

FIG. 11C is an external view of an electronic book reader 921. This electronic book reader 921 includes a display portion 922 and operation switches 923. The electronic book reader 921 may incorporate a modem or may incorporate the RFCPU shown in FIG. 8 so that information can be transmitted and received wirelessly. By applying the liquid crystal display device shown in FIGS. 9A and 9B or the EL display device shown in FIGS. 10A and 10B to the display portion 922, an image with high image quality can be displayed.

Figure 12A:
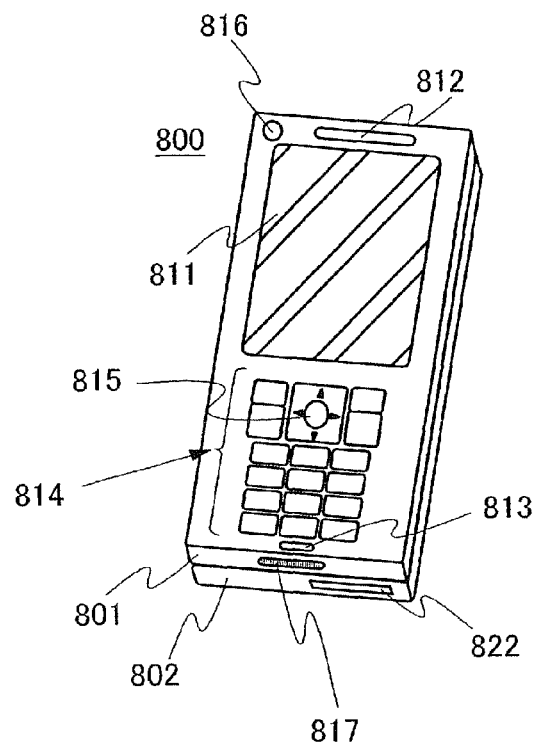
FIGS. 12A to 12C are diagrams showing an electronic device using an SOI substrate.
Figure 12B:
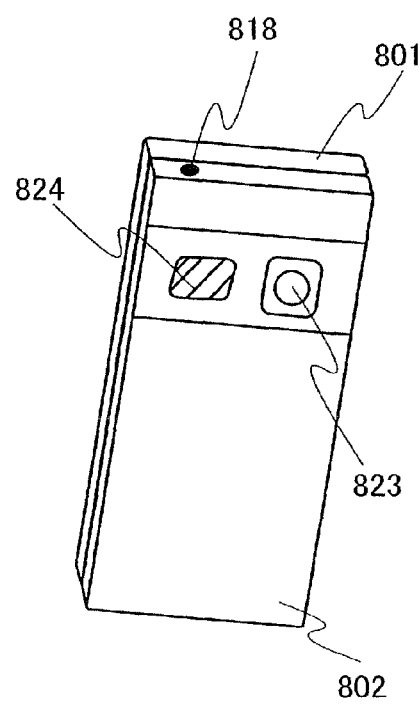
Figure 12C:
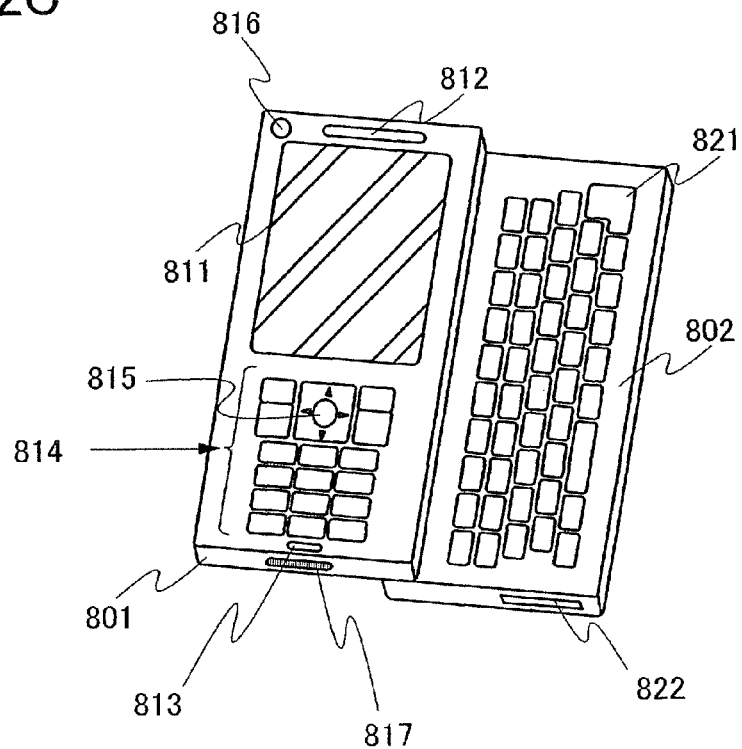

FIGS. 12A to 12C show another example of a mobile phone 800 of this embodiment mode. FIG. 12A is a front view, FIG. 12B is a rear view, and FIG. 12C is a developed view in which two chassis are slid. A mobile phone 800 has both functions of a mobile phone and a portable information terminal, and incorporates a computer. The mobile phone 800 is an electronic device so-called a smartphone which is capable of various data processing in addition to voice calls.

The mobile phone 800 has chassis 801 and 802. The chassis 801 includes a display portion 811, a speaker 812, a microphone 813, operation keys 814, a pointing device 815, a camera lens 816, an external connection terminal 817, an earphone terminal 818, and the like. The chassis 802 includes a keyboard 821, an external memory slot 822, a camera lens 823, a light 824, and the like. In addition, an antenna is incorporated in the chassis 801. By applying the liquid crystal display device shown in FIGS. 9A and 9B or the EL display device shown in FIGS. 10A and 10B to the display portion 811, the display portion 811 can have little display unevenness and excellent image quality.

Further, in addition to the above-described structure, the mobile phone 800 may incorporate a non-contact IC chip, a small memory device, or the like.

The display portion 811 changes the display orientation as appropriate depending on a usage mode. Since the camera lens 816 is provided in the same plane as the display portion 811, the mobile phone 800 can be used as a videophone. Further, a still image and a moving image can be taken with the camera lens 823 and the light 824, using the display portion 811 as a viewfinder. The speaker 812 and the microphone 813 can be used for video calls, recording, reproducing, and the like without being limited to voice calls. With the use of the operation keys 814, making and receiving calls, inputting simple information such as e-mails, scrolling the screen, moving the cursor, and the like are possible. Furthermore, the chassis 801 and 802 (FIG. 12A) which are overlapped with each other, are developed by sliding as shown in FIG. 12C, and can be used as a portable information terminal. In this case, smooth operation can be conducted using the keyboard 821 and the pointing device 815. The external connection terminal 817 can be connected to an AC adaptor and various types of cables such as a USB cable, and charging and data communication with a personal computer or the like are possible. In addition, by inserting a recording medium in the external memory slot 822, a larger amount of data can be stored and moved.

Further, in addition to the above-described functions, the mobile phone may include an infrared communication function, a television receiving function, or the like.

Through the above process, electronic devices or lighting equipment can be obtained by applying the light-emitting device described in this embodiment mode. The applicable range of the light-emitting device described in this embodiment mode is so wide that the light-emitting device is applicable to electronic devices in various fields.

Note that the method for manufacturing an SOI substrate described in this embodiment mode can be appropriately combined with the manufacturing methods described in other embodiment modes of this specification.

This application is based on Japanese Patent Application serial no. 2008-026447 filed with Japan Patent Office on Feb. 6, 2008, the entire contents of which are hereby incorporated by reference.

What is claimed is:

1. A method for manufacturing an SOI substrate comprising the steps of:
   forming a plurality of first single crystal semiconductor films over a first substrate having an insulating surface with intervals between the plurality of first single crystal semiconductor films;

forming a semiconductor film over the plurality of first single crystal semiconductor films;

performing planarization treatment on the semiconductor film so as to expose the first single crystal semiconductor films;

forming a first insulating film over the first single crystal semiconductor films and the semiconductor film;

superposing a plurality of single crystal semiconductor substrates in each of which a first fragile layer is formed at a predetermined depth on the first insulating film such that the semiconductor film is superimposed over the plurality of single crystal semiconductor substrates;

forming a plurality of second single crystal semiconductor films over the first insulating film by separation at the first fragile layer through heat treatment;

exposing the first single crystal semiconductor films by etching the first insulating film with the second single crystal semiconductor films used as masks;

forming a third single crystal semiconductor film over the first substrate using the first single crystal semiconductor films and the second single crystal semiconductor films as seed layers;

forming a second fragile layer by introducing ions into the third single crystal semiconductor film;

forming a second insulating film which functions as a bonding layer over the third single crystal semiconductor film; and fixing a part of the third single crystal semiconductor film to the second substrate with the second insulating film interposed therebetween by superposing the first substrate on a second substrate having an insulating surface and separating the third single crystal semiconductor film at the second fragile layer through heat treatment.

2. The method for manufacturing an SOI substrate according to claim 1, further comprising the step of performing planarization treatment on either one or both of a surface of the third single crystal semiconductor film which is left over the first substrate and a surface of the third single crystal semiconductor film which is fixed to the second substrate after separation at the second fragile layer.

3. The method for manufacturing an SOI substrate according to claim 1,
wherein irradiation of laser light is performed as the planarization treatment.

4. The method for manufacturing an SOI substrate according to claim 1,
wherein a glass substrate is used as the first substrate and the second substrate.

5. The method for manufacturing an SOI substrate according to claim 1,
wherein the third single crystal semiconductor film is formed by crystallizing a semiconductor film formed over the first single crystal semiconductor films and the second single crystal semiconductor films by solid phase growth through heat treatment.

6. The method for manufacturing an SOI substrate according to claim 1,
wherein the semiconductor film is an amorphous semiconductor film.

7. The method for manufacturing an SOI substrate according to claim 1,
wherein the third single crystal semiconductor film is formed by vapor phase growth of the semiconductor film formed over the first single crystal semiconductor films and the second single crystal semiconductor films by a CVD method.

8. A method for manufacturing an SOI substrate comprising the steps of:
forming a plurality of first single crystal semiconductor films over a first substrate having an insulating surface with intervals between the plurality of first single crystal semiconductor films;

forming a semiconductor film over the plurality of first single crystal semiconductor films;

performing planarization treatment on the semiconductor film so as to expose the first single crystal semiconductor films;

forming a first insulating film over the first single crystal semiconductor films and the semiconductor film;

superposing a plurality of single crystal semiconductor substrates in each of which a first fragile layer is formed at a predetermined depth on the first insulating film such that the semiconductor film is superimposed over the plurality of single crystal semiconductor substrates;

forming a plurality of second single crystal semiconductor films over the first insulating film by separation at the first fragile layer through heat treatment;

exposing the first single crystal semiconductor films by etching the first insulating film with the second single crystal semiconductor films used as masks;

forming a third single crystal semiconductor film over the first substrate using the first single crystal semiconductor films and the second single crystal semiconductor films as seed layers;

forming a second fragile layer by introducing ions into the third single crystal semiconductor film;

forming a second insulating film which functions as a bonding layer over the third single crystal semiconductor film;

fixing a part of the third single crystal semiconductor film to the second substrate with the second insulating film interposed therebetween by superposing the first substrate on a second substrate having an insulating surface and separating the third single crystal semiconductor film at the second fragile layer through first heat treatment;

forming a third fragile layer by introducing ions into a single crystal semiconductor film formed over the second substrate;

forming a third insulating film over the second substrate;

fixing a part of the single crystal semiconductor film to a third substrate with the third insulating film interposed therebetween by superposing the third substrate on the second substrate and separating the single crystal semiconductor film at the third fragile layer through second heat treatment.

9. The method for manufacturing an SOI substrate according to claim 8,
wherein the single crystal semiconductor film over the second substrate is formed by crystallizing a semiconductor film formed over the third single crystal semiconductor film by solid phase growth through heat treatment.

10. The method for manufacturing an SOI substrate according to claim 8,
wherein the semiconductor film is an amorphous semiconductor film.

11. The method for manufacturing an SOI substrate according to claim 8,
wherein the single crystal semiconductor film over the second substrate is formed by vapor phase growth of the semiconductor film formed over the third single crystal semiconductor film by a CVD method.

* * * * *